(12) United States Patent
Zerbe et al.

(10) Patent No.: US 7,137,048 B2
(45) Date of Patent: *Nov. 14, 2006

(54) METHOD AND APPARATUS FOR EVALUATING AND OPTIMIZING A SIGNALING SYSTEM

(75) Inventors: Jared Zerbe, Woodside, CA (US); Pak Shing Chau, San Jose, CA (US); William Franklin Stonecypher, San Jose, CA (US)

(73) Assignee: Rambus Inc., Los Altos, CA (US)

( * ) Notice: Subject to any disclaimer, the term of this patent is extended or adjusted under 35 U.S.C. 154(b) by 409 days.

This patent is subject to a terminal disclaimer.

(21) Appl. No.: 09/976,170

(22) Filed: Oct. 12, 2001

(65) Prior Publication Data

US 2003/0208707 A9   Nov. 6, 2003

Related U.S. Application Data

(63) Continuation-in-part of application No. 09/776,550, filed on Feb. 2, 2001.

(51) Int. Cl.
*G01R 31/28* (2006.01)
(52) U.S. Cl. ................ 714/715; 714/739; 375/224
(58) Field of Classification Search ................ 714/715
See application file for complete search history.

(56) References Cited

U.S. PATENT DOCUMENTS

| | | | |
|---|---|---|---|
| 3,869,580 A | 3/1975 | Ragsdale | |
| 3,909,563 A | 9/1975 | Ghosh et al. | |
| 4,271,514 A | 6/1981 | Parras et al. | |
| 4,475,210 A * | 10/1984 | Couch | 375/224 |
| 4,727,540 A | 2/1988 | Lacroix et al. | |
| 5,142,495 A | 8/1992 | Canepa | |
| 5,197,062 A | 3/1993 | Picklesimer | |
| 5,228,042 A * | 7/1993 | Gauthier et al. | 714/716 |
| 5,237,561 A * | 8/1993 | Pyhalammi | 370/244 |
| 5,258,986 A | 11/1993 | Zerbe | |
| 5,265,089 A | 11/1993 | Yonehara | |

(Continued)

FOREIGN PATENT DOCUMENTS

EP    0333942    9/1989

(Continued)

OTHER PUBLICATIONS

J.C. Newell, "High Speed Psuedo-Random Binary Sequence Generation for Testing and Data Scrambling in Gigabit Optical Transmission Systems", IEEE Coloquium, Apr. 3, 1992, pp. 1-4.*

(Continued)

*Primary Examiner*—Guy Lamarre
*Assistant Examiner*—John P. Trimmings
(74) *Attorney, Agent, or Firm*—Hunton & Williams LLP

(57) ABSTRACT

A method and apparatus for evaluating and optimizing a signaling system is described. A pattern of test information is generated in a transmit circuit of the system and is transmitted to a receive circuit. A similar pattern of information is generated in the receive circuit and used as a reference. The receive circuit compares the patterns. Any differences between the patterns are observable. In one embodiment, a linear feedback shift register (LFSR) is implemented to produce patterns. An embodiment of the invention may be practiced with various types of signaling systems, including those with single-ended signals and those with differential signals. An embodiment of the invention may be applied to systems communicating a single bit of information on a single conductor at a given time and to systems communicating multiple bits of information on a single conductor simultaneously.

22 Claims, 26 Drawing Sheets

U.S. PATENT DOCUMENTS

| | | | |
|---|---|---|---|
| 5,369,755 A * | 11/1994 | Berkovich | 710/100 |
| 5,383,177 A | 1/1995 | Tateishi | |
| 5,392,298 A | 2/1995 | Shinjo | |
| 5,412,665 A | 5/1995 | Gruodis et al. | |
| 5,430,736 A | 7/1995 | Takeoka et al. | |
| 5,444,715 A | 8/1995 | Gruetzner et al. | |
| 5,473,619 A | 12/1995 | Sakaguchi | |
| 5,483,676 A * | 1/1996 | Mahany et al. | 455/67.14 |
| 5,485,473 A | 1/1996 | Diebold et al. | |
| 5,490,150 A | 2/1996 | Andrews et al. | |
| 5,519,719 A | 5/1996 | Elpers et al. | |
| 5,675,588 A * | 10/1997 | Maruyama et al. | 714/715 |
| 5,726,991 A * | 3/1998 | Chen et al. | 714/704 |
| 5,732,089 A * | 3/1998 | Negi | 714/704 |
| 5,742,798 A | 4/1998 | Goldrian | |
| 5,761,212 A * | 6/1998 | Foland et al. | 714/719 |
| 5,761,216 A * | 6/1998 | Sotome et al. | 714/738 |
| 5,790,523 A | 8/1998 | Ritchie, Jr. et al. | |
| 5,802,073 A * | 9/1998 | Platt | 714/733 |
| 5,831,996 A | 11/1998 | Abramovici et al. | |
| 5,841,271 A | 11/1998 | Nakayama | |
| 5,875,177 A | 2/1999 | Uriu et al. | |
| 5,917,856 A | 6/1999 | Torsti | |
| 5,938,784 A | 8/1999 | Kim | |
| 5,999,022 A | 12/1999 | Iwata et al. | |
| 6,003,118 A * | 12/1999 | Chen | 711/167 |
| 6,055,297 A * | 4/2000 | Terry | 379/1.01 |
| 6,061,817 A | 5/2000 | Jones et al. | |
| 6,073,263 A | 6/2000 | Arkin et al. | |
| 6,154,659 A * | 11/2000 | Jalali et al. | 455/522 |
| 6,160,790 A | 12/2000 | Bremer | |
| 6,201,829 B1 * | 3/2001 | Schneider | 375/221 |
| 6,222,380 B1 * | 4/2001 | Gerowitz et al. | 326/38 |
| 6,230,022 B1 * | 5/2001 | Sakoda et al. | 455/522 |
| 6,289,045 B1 | 9/2001 | Hasegawa et al. | |
| 6,292,116 B1 | 9/2001 | Wang et al. | |
| 6,331,787 B1 * | 12/2001 | Whitworth et al. | 326/30 |
| 6,339,387 B1 * | 1/2002 | Koga | 341/100 |
| 6,378,079 B1 * | 4/2002 | Mullarkey | 713/401 |
| 6,385,236 B1 | 5/2002 | Chen | |
| 6,407,572 B1 | 6/2002 | Kanase et al. | |
| 6,421,801 B1 * | 7/2002 | Maddux et al. | 714/744 |
| 6,438,159 B1 | 8/2002 | Uber et al. | |
| 6,473,871 B1 | 10/2002 | Coyle et al. | |
| 6,477,674 B1 | 11/2002 | Bates et al. | |
| 6,574,758 B1 * | 6/2003 | Eccles | 714/712 |
| 6,606,041 B1 * | 8/2003 | Johnson et al. | 341/120 |
| 6,611,928 B1 | 8/2003 | Fujiyoshi et al. | |
| 6,625,764 B1 | 9/2003 | Dawson | |
| 6,631,486 B1 * | 10/2003 | Yoshida et al. | 714/724 |
| 6,650,698 B1 * | 11/2003 | Liau et al. | 375/229 |
| 6,671,847 B1 * | 12/2003 | Chao et al. | 714/744 |
| 6,674,998 B1 * | 1/2004 | Prentice | 455/114.2 |
| 6,684,350 B1 | 1/2004 | Theodoras, II et al. | |
| 6,684,351 B1 * | 1/2004 | Bendak et al. | 714/715 |
| 6,693,881 B1 * | 2/2004 | Huysmans et al. | 370/236.1 |
| 6,694,466 B1 | 2/2004 | Tsai et al. | |
| 6,873,939 B1 * | 3/2005 | Zerbe et al. | 702/189 |
| 2001/0016929 A1 * | 8/2001 | Bonneau et al. | 714/735 |
| 2001/0021987 A1 | 9/2001 | Govindarajan et al. | |
| 2001/0034866 A1 | 10/2001 | Barry et al. | |
| 2001/0043648 A1 * | 11/2001 | Ducaroir et al. | 375/224 |
| 2002/0040459 A1 * | 4/2002 | Watanabe et al. | 714/738 |
| 2002/0059545 A1 | 5/2002 | Nakashima et al. | |
| 2002/0059546 A1 | 5/2002 | Yonetoku | |
| 2002/0073373 A1 | 6/2002 | Nakao et al. | |
| 2002/0108079 A1 | 8/2002 | Takahashi | |
| 2002/0138800 A1 | 9/2002 | Kim et al. | |
| 2002/0178412 A1 | 11/2002 | Matsui | |
| 2003/0043752 A1 * | 3/2003 | Totsuka et al. | 370/249 |
| 2003/0065995 A1 | 4/2003 | Barrett | |
| 2003/0070118 A1 | 4/2003 | Nakao et al. | |
| 2003/0088818 A1 | 5/2003 | Manning | |
| 2003/0131297 A1 | 7/2003 | Fischel et al. | |

FOREIGN PATENT DOCUMENTS

| | | |
|---|---|---|
| EP | 1 134 668 A2 | 9/2001 |
| JP | 4-147071 | 5/1992 |
| JP | 4-246921 | 9/1992 |
| JP | 2000-35831 | 2/2000 |

OTHER PUBLICATIONS

The Ouroboros of the Digital Consciousness . . . , Jan. 4, 1996.

Test High-Speed Drivers with Bursts . . . , May 12, 1994.

Use LFSRs to Build Fast FPGA-Based Counters, Mar. 21, 1994.

Accurate On-Chip Interconnect Evaluation . . . , May 1999.

Multi-gigabit Signaling with CMOS, May 12, 1997.

HOTLink Built-In Self-Test (BIST), Mar. 11, 1999.

Accurate *In Situ* Measurement of Peak Noise and Delay Change . . . , Oct. 2001.

Wide-Band Network Characterization by Fourier Transformation . . . , Aug. 1969.

Modeling of High-Speed, Large-Signal Transistor Switching . . . , Apr. 1982.

Characterization of Individual Weights in Transversal Filters . . . , Dec. 1982.

\* cited by examiner

METHOD AND APPARATUS FOR EVALUATING AND OPTIMIZING A SIGNALING SYSTEM

RELATED APPLICATIONS

The present application is a continuation-in-part of U.S. patent application Ser. No. 09/776,550, filed on Feb. 2, 2001 and assigned to the Assignee of the present application.

TECHNICAL FIELD OF THE INVENTION

The invention relates generally to communication systems and, more specifically, to in-situ testing of communications systems.

BACKGROUND OF THE INVENTION

For information communication and processing systems to operate reliably, it is important to be able to test these systems and measure various performance characteristics that pertain to them. Classically, it has been very difficult to observe the fidelity of a signaling system from a transmit circuit to a receive circuit, including a medium through which the transmit circuit is coupled to the receive circuit. It has been especially difficult to obtain in-situ measurements of the operation of the system. Rather, external test equipment is typically introduced into the system for the purpose of obtaining measurements. It is common for an external signal generator, for example one capable of producing test signals with ultrafast or adjustable transition times, and an external measurement device, such as an oscilloscope, to be connected to a system under test. However, since such external test equipment has characteristics different from system under test, measurements derived using the external test equipment may not accurately reflect the actual performance of the system under test.

While it was possible to obtain meaningful information from simpler systems of the past using external test equipment, the increasing complexity and operating frequencies of modern systems introduce additional complications that impair the effectiveness of testing using external test equipment. For example, much higher frequencies and controlled impedances make it much harder to introduce external test equipment without distorting the signals being measured and, therefore, affecting the measurements themselves. Moreover, connection and disconnection of the external test equipment requires time, effort, and, potentially, additional design considerations, such as the provision of test points within a system. Also, external test equipment does not allow testing to be performed from the perspective of the actual receive circuit within the system. Thus, such testing cannot definitively provide information as to what the receive circuit actually receives. Therefore, traditional testing techniques fail to provide complete and accurate information about the system under test. Thus, a technique is needed to provide complete and accurate information about a system under test and to enable in-situ testing of the system.

DETAILED DESCRIPTION OF A PREFERRED EMBODIMENT

Figure 1:
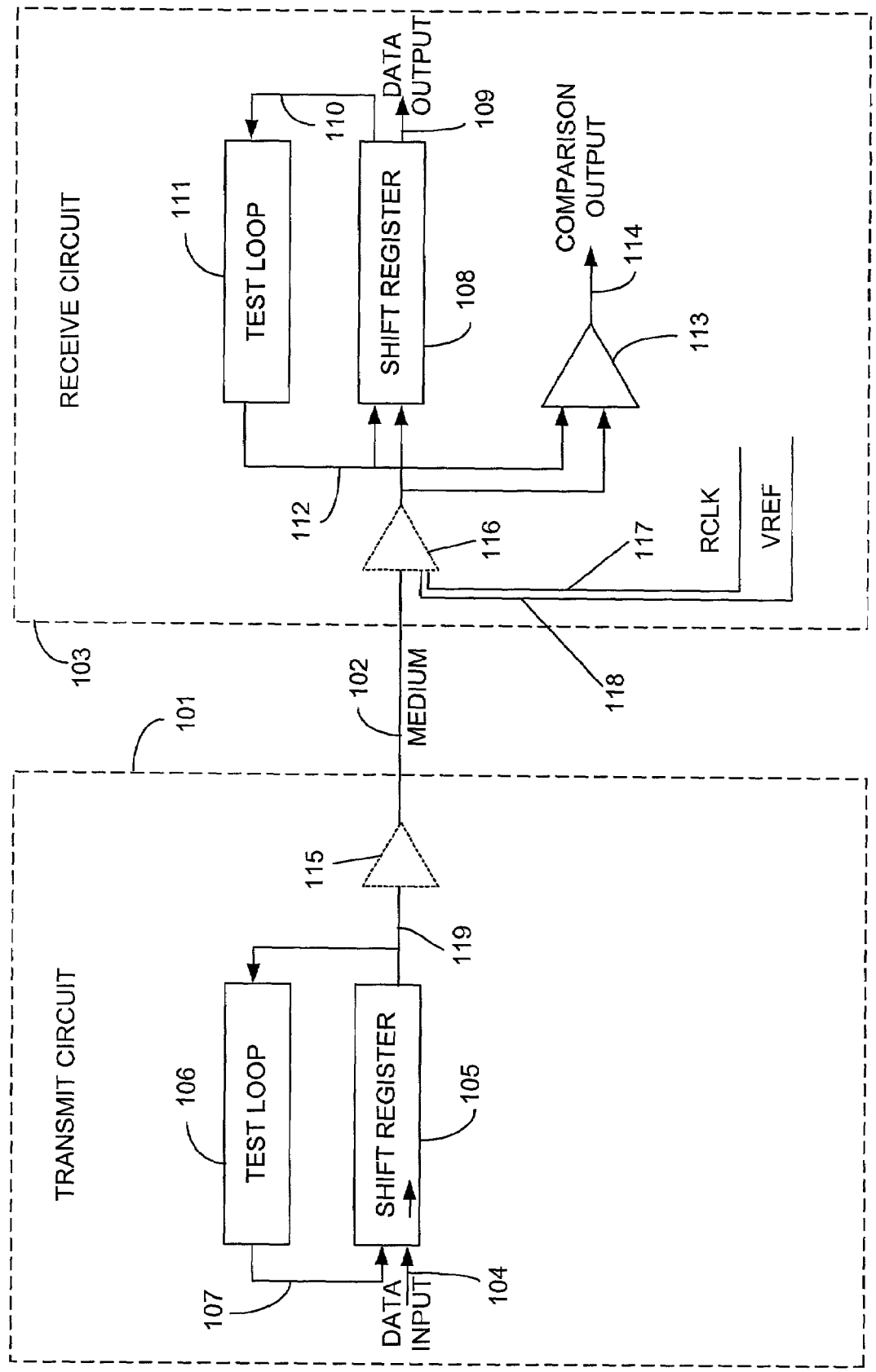
FIG. 1 is a block diagram illustrating a signaling system in accordance with an embodiment of the invention.

A method and apparatus for evaluating and optimizing a signaling system is described. Evaluation is accomplished using the same circuits actually involved in normal operation of the signaling system. Such circuits are adapted to provide testing capability with minimal additional complexity. Thus, capability for in-situ testing of a signaling system is provided, and information may be obtained from the actual perspective of a receive circuit in the system. Both the need for the introduction of external test equipment and the inaccuracy caused by its introduction are avoided. An embodiment of the invention may be implemented to provide a built-in self-test (BIST) capability within an operational system. Such capability can be very beneficial, especially where access to internal components of a system would otherwise be difficult. For example, in addition to being applicable to signaling systems where the transmit circuit is located separately from the receive circuit, an embodiment of the invention may be applied to a relatively closed system, for example, a system fabricated as an integrated circuit. Thus, even when an integrated circuit is packaged, extensive internal evaluation and optimization capability may be provided in accordance with the invention.

A pattern of test information is generated in a transmit circuit of the system and is transmitted to a receive circuit. A similar pattern of information is generated in the receive circuit and used as a reference. The receive circuit receives the pattern of test information generated in the transmit circuit and compares it to the pattern of information generated in the receive circuit. Any differences between the patterns are observable. Preferably, the patterns are repeating patterns that allow many iterations of testing to be performed. Thus, even events that occur infrequently within the system may be observed.

In one embodiment, a linear feedback shift register (LFSR) is implemented to produce patterns. Information obtained from testing may be used to assess the effects of various system parameters, including but not limited to output current, crosstalk cancellation coefficients, and self-equalization coefficients, and system parameters may be adjusted to optimize system performance. Embodiments of the invention may be used in assessing a wide variety of phenomena, including, but not limited to, overshoot, undershoot, edge rates, crosstalk, duty cycle error (including the cumulative duty cycle error across the transmit circuit, the medium, and the receive circuit), impedance continuity/discontinuity, and the effectiveness of different receive and transmit effects. An embodiment of the invention may be practiced with various types of signaling systems, including those with single-ended signals and those with differential signals. An embodiment of the invention may be applied to systems communicating a single bit of information on a single conductor at a given time and to systems communicating multiple bits of information on a single conductor simultaneously.

Several embodiments of the invention described herein are particularly useful for obtaining data expressing attributes of waveforms communicated from the transmit circuit to the receive circuit. As a brief example that is described in greater detail with reference to the drawings, the following process is performed: a transmit repeating pattern is initially transmitted to the receive circuit, one or more parameters affecting reception of the transmit repeating pattern in the receive circuit are set, the receive circuit is placed in a mode wherein the receive circuit generates a receive repeating pattern, the transmit repeating pattern is repeatedly transmitted to the receive circuit, any variation in the relationship between the transmit repeating pattern as received by the receive circuit and the receive repeating pattern is detected, the values of the parameters in effect during such variation are stored, and the process (or a portion thereof) is repeated for different values of the parameters.

Variations detected in such a process occur when the relationship between the transmit repeating pattern as received by the receive circuit and the receive repeating pattern does not remain fixed over multiple iterations of the patterns. Since, logically, the relationship between the patterns is known to be fixed, such variations indicate failures involving uncertainty in the communication of the transmit repeating pattern to the receive circuit. Such failures can occur when the parameters affecting reception of the transmit repeating pattern in the receive circuit are set to values that border on ranges of values of the parameters that provide for accurate communication of the transmit repeating pattern to the receive circuit.

When the parameters are set to values within the range of values that provide for accurate communication of the transmit repeating pattern to the receive circuit, accurate communication is reliably provided. Thus, no variations are detected in the relationship between the transmit repeating pattern as received by the receive circuit and the receive repeating pattern. When the parameters are set to values well outside the range of values that provide for accurate communication of the transmit repeating pattern to the receive circuit, the transmit repeating pattern is consistently misinterpreted by the receive circuit, thereby yielding a relationship between the transmit repeating pattern as received by the receive circuit and the receive repeating pattern that does not vary. Thus, no variation is detected. Then, the relationship between the transmit repeating pattern and the receive repeating pattern may be said to exhibit repeatability. However, when the parameters are set to critical values bordering the ranges of values that provide for accurate communication, the transmit repeating pattern will sometimes be accurately interpreted by the receive circuit, but, at other times, the transmit repeating pattern will be inaccurately interpreted by the receive circuit. Thus, variation will occur and will be detected. Then, the relationship between the transmit repeating pattern and the receive repeating pattern may be said to exhibit non-repeatability. Such a phenomenon can occur when parameters such as a timing margin (e.g., setup and hold times) or a voltage margin are set to values insufficient to provide reliably accurate communication. A parameter affecting the voltage margin may be set by setting a voltage reference used for the comparison of voltages of a signal representing the transmit repeating pattern being received at the receive circuit.

By performing such testing over multiple iterations over large numbers of combinations of parameter values, the subset of those combinations where variations occur can be identified. If each parameter is represented by a dimension in an n-dimensional space (for n parameters), the subset of the combinations where variations occur can be mapped into that n-dimensional space. For example, using two parameters (e.g., timing margin and voltage margin), a two-dimensional mapping can be provided. For typical receive circuit components, variations tend to be observed across contiguous combinations of parameter values. Thus, such a two-dimensional mapping typically exhibits one or more lines or continuous curves formed from adjacent points representing combinations of parameter values yielding variations. The thickness or width of such lines or curves depends on the number of critical values of parameters for which variations are observed, especially when several values of one parameter yield variation for a fixed value of another parameter.

For relatively thin or narrow lines or curves, the mapping approximates a trace of the transmit repeating pattern as received at the receive circuit of the sort that one having experience using an oscilloscope would perceive as familiar. Thus, embodiments of the invention may be used to display an eye diagram of multiple iterations of the transmit repeating pattern, or, by altering the timing of the transmit repeating pattern and the receive repeating pattern as multiples or sub-multiples of one another, the trace can be "unfolded" to yield a display without overlap of different aspects of the waveform represented by the mapping, thereby allowing finer details of the waveform to be observed. Therefore, embodiments of the invention may be used to provide an in-situ "virtual oscilloscope" capability for observing representations of signals while avoiding external influences on system behavior typically introduced when traditional test instruments are coupled to a system under test.

FIG. 1 is a block diagram illustrating a signaling system in accordance with an embodiment of the invention. The system comprises transmit circuit 101, medium 102, and receive circuit 103. Transmit circuit 101 comprises shift register 105 and test loop 106. Transmit circuit 101 can operate in a normal mode or a test mode. In the normal mode, shift register 105 receives data via a data input 104, which may be a parallel or serial data input. Shift register 105 shifts the bits of the data to the right, providing each bit as a output at the interface with medium 102.

The data are transmitted across medium 102 to receive circuit 103. In addition to providing output to medium 102, shift register 105 also provides its output to test loop 106. Test loop 106 provides an input 107 to shift register 105. In the test mode, shift register 105 and test loop 106 function to generate a test pattern for transmission over medium 102. The test pattern is preferably, although not necessarily a repeating pattern. Test loop 106 may be a simple loop, such as a loop of wire, or it may include other combinational and/or sequential logic. For example, it may include logic gates such as AND, OR, NAND, NOR, XOR, and/or XNOR gates. Such gates may be used to implement an LFSR. An LFSR is capable of producing maximal-length repeating patterns with a minimum of additional complexity. The LFSR can produce pseudo-random bit sequences (PRBS), which may be beneficially applied to testing the system under a wide variety of logical conditions. When an LFSR is implemented, test loop 106 serves as a transmit linear feedback logic gate and shift register 105 serves as a transmit shift register. Coupling 119, which couples shift register 105, test loop 106, and, optionally, transmitter 115 or medium 102, serves as transmit shift register output. Coupling 107 serves as a transmit shift register input when the transmit circuit is operating in a test mode. When an LFSR is implemented, additional transmit shift register outputs can be provided from shift register 105 to additional transmit linear feedback logic inputs of test loop 106.

Receive circuit 103 includes shift register 108 and test loop 111. In the normal mode, receive circuit 103 receives data from the transmit circuit 101 via medium 102, which may, as one example, be an electrical conductor coupling the transmit circuit 101 to the receive circuit 103. The bits of the data are shifted through shift register 108 and provided at data output 109. When an LFSR is implemented, test loop 111 serves as a receive linear feedback logic gate and shift register 108 serves as a receive shift register. Coupling 110, which couples shift register 108 to test loop 111 serves as receive shift register output. Coupling 112 serves as a receive shift register input when the receive circuit is operating in a test mode. When an LFSR is implemented, additional receive shift register outputs can be provided from shift register 108 to additional receive linear feedback logic inputs of test loop 111.

As appropriate, the transmit circuit 101 may include a transmitter 115 coupled to medium 102 and the receive circuit 103 may include a receiver 116 coupled to the medium 102. In that case, an output of shift register 105 is coupled to an input of transmitter 115 and to an input of test loop 106. The output of transmitter 115 is coupled to medium 102. Medium 102 is coupled to an input of receiver 116. A receive clock signal is provided at input 117 of receiver 116. A voltage reference signal is provided at input 118 of receiver 116. Both the receive clock signal at input 117 and the voltage reference signal may be varied over a wide range to allow testing of the system under a wide variety of conditions.

Transmitter 115 may be any suitable transmitter. An example includes, but is not limited to, a driver circuit for driving signals onto medium 102. The driver circuit may provide desirable characteristics, for example, a controlled source impedance and well-defined transition times. Transmitter 115 may provide a single-ended signal or a differential signal over medium 102. Transmitter 115 may be able to communicate one or more bits of information over a single conductor simultaneously.

Likewise, receiver 116 may be any suitable receiver. An example includes, but is not limited to, a receiver for determining digital signaling levels of signals present on medium 102. Receiver 116 may provide desirable characteristics, for example, one or more voltage or current level thresholds, controlled hysteresis, and controlled timing.

Receiver 116 may be configured to receive a single-ended signal or a differential signal from medium 102. Receiver 116 may be able to receive one or more bits of information over a single conductor simultaneously.

While subsequent Figures, for example, FIGS. 4, 6, 9, and 10 are illustrated without a transmitter such as transmitter 115, the embodiments of these Figures may be implemented with such a transmitter. While subsequent Figures, for example, FIGS. 5, 7, 12, and 13 are illustrated without a receiver such as receiver 116, the embodiments of these Figures may be implemented with such a receiver.

Shift register 108 is coupled to test loop 111 via coupling 110. The output of the test loop 111 is coupled back to an input of shift register 108 and also to an input of comparison circuit 113, which may, as one example, be implemented using an XOR logic gate. Another input of the comparison circuit 113 is coupled to medium 102 and receives the test pattern transmitted by transmit circuit 101 over medium 102. Comparison circuit 113 provides a comparison output 114. In the test mode, shift register 108 and test loop 111 operate to produce a pattern identical to or deterministically related to the pattern produced by transmit circuit 101. Comparison circuit 113 compares the pattern generated in the transmit circuit 101 to the pattern generated in the receive circuit 103 to determine for each bit whether the patterns match. To establish a relationship between the pattern produced by the transmit circuit 101 and the pattern produced by the receive circuit 103, information to synchronize the pattern of the receive circuit 103 with the pattern of the transmit circuit 101 may be communicated from the transmit circuit 101 to the receive circuit 103, or elements of the receive circuit may be preloaded with such information.

The system may be operated in roll test mode. In the roll test mode, the patterns need not necessarily match, as long as they are repeatable. In the roll test mode, the system operates as a "repeatability detector." The roll test mode generates repeating patterns, and, upon comparison, any variation from the repeating patterns is detected. Thus, the pattern generated by the transmit circuit and the pattern generated by the receive circuit need not be the same. In fact, the receive circuit is not preloaded with information to synchronize its pattern with that of the transmit circuit. Rather, the receive circuit is seeded by the transmit circuit.

In the roll test mode, the timing of receiver 116 may be adjusted, for example, swept over a range, by varying the receive clock signal at node 117, and the symbol thresholds of receiver 116 may be adjusted, for example, swept over a range, by varying the voltage reference signal at node 118. While the voltage reference signal is stated in terms of voltage, it may be implemented to allow adjustment of other electrical parameters relating to reception of signals at receiver 116.

Shift registers with which embodiments of the invention may be implemented, for example, shift registers 105 and 108, preferably comprise a plurality of registers coupled to one another. As an example, such registers are preferably implemented using D flip flops with the Q output of one D flip flop coupled to the D input of a subsequent D flip flop. The D flip flops of a shift register are preferably clocked in unison with one another.

Several signaling systems such as that illustrated in FIG. 1 may be used together. For example, a transmit circuit of a first signaling system may be used to produce a pattern, and a receive circuit of a second signaling system may be used to observe any influence of the pattern of the first signaling system on the second signaling system. Such a technique is useful, for example, to observe crosstalk that may occur between the signaling systems. Since crosstalk can occur without an intentional connection between the signaling systems, no such connection needs to be made between the signaling systems, and the media of the signaling systems may be electrically insulated from one another.

In the embodiment illustrated in FIG. 1, shift register 105 and test loop 106 form a transmit repeating pattern generator capable of producing a repeating pattern signal. Data input 104 serves as a transmit data input, and medium 102 provides a transmit data output for the transmit circuit 101 and a receive data input for the receive circuit 103. The transmit circuit 101 produces a transmit data output signal at the transmit data output based on a transmit data input signal obtained from the transmit data input when the transmit circuit is operating in a normal mode. When the transmit circuit 101 is operating in a test mode, the transmit circuit 101 produces a transmit data output signal at the transmit data output based on repeating pattern signal.

The receive circuit 103 is operably coupled to the transmit circuit 101 via medium 102. The receive circuit 103 receives the transmit data output signal from the transmit circuit at the receive data input. The shift register 108 and the test loop 111 form a receive repeating pattern generator capable of producing a receive repeating pattern, which may or may not be the same pattern as the repeating pattern signal produced by the transmit circuit. Data output 109 serves as a receive data output. When the receive circuit 103 is operating in the normal mode, the receive circuit 103 produces a receive data output signal at the receive data output based on the transmit data output signal. When the receive circuit 103 is operating in the test mode, the receive circuit 103 produces a comparison signal based on comparison dependent on the transmit data output signal and the receive repeating pattern signal.

At this point it should be noted that the transmit repeating pattern may be received in a test receiver (not shown) separate from the receive circuit 103 when the transmit circuit 101 is operating in a test mode. Also, the transmit repeating pattern may be transmitted from a test transmitter (not shown) separate from the transmit circuit 101 when the receive circuit 103 is operating in a test mode.

The shift register 105 of the transmit circuit 101 may be thought of as a transmit data storage element. Alternatively, the transmit data storage element may be implemented using another structure capable of storing data and allowing the sequential transmission of the data, for example, when the transmit circuit 101 is operated in a normal mode. In the test mode, the transmit data storage element is capable of providing a repeating pattern signal, wherein the transmit circuit 101 sequentially transmits the transmit data output signal based on the repeating pattern signal. The repeating pattern signal may represent a sequence of data bits, with the transmit data storage element storing each of the data bits, or the repeating pattern signal may have a data length greater than the data capacity of the transmit data storage element. For example, a LFSR may be used to produce a repeating pattern signal having a data length (e.g., a number of bits produced as the repeating pattern signal before the repeating pattern signal begins repeating) much greater than the data capacity of the transmit data storage element (e.g., the number of bits that can be stored in the transmit data storage element).

The transmit data storage element may be divided into transmit data storage sub-elements during operation in the normal mode. For example, odd-numbered bits may be handled by one sub-element (e.g., one pipeline structure), while even-numbered bits may be handled by another sub-element (e.g., another pipeline structure). Thus, distinct data are passed through each of the plurality of sub-elements when the transmit circuit is operating in the normal mode. Since such sub-elements may be rather short, they might not yield a repeating pattern signal having a sufficiently high level of desired entropy in the test mode. Thus, the transmit data storage sub-elements may be united into a single unit in the form of the transmit data storage element for providing the repeating pattern signal when the transmit circuit is operating in the test mode. Thus, a much "richer" repeating pattern signal exhibiting substantially higher entropy may be provided. Alternatively, if higher entropy is not needed, the longer data length of the repeating pattern signal made possible by such union may be used to specify a longer specific bit sequence for the repeating pattern signal.

The data storage element may be loaded from the transmit data input to initialize the test mode from a source other than the transmit data input, for example, the transmit data storage element may be loaded via a parallel transmit load input.

In the receive circuit 103, the shift register 108 may be thought of as a receive data storage element. Alternatively, the receive data storage element may be implemented using another structure capable of storing information relating to either a receive data input signal or a repeating pattern signal. In the normal mode, the receive data storage element outputs a receive data output signal based on a receive data input signal received at the receive data input. In the test mode, the receive data storage element provides the repeating pattern signal. The repeating pattern signal may represent a sequence of data bits, with the receive data storage element storing each of the data bits, or the repeating pattern signal may have a data length greater than the data capacity of the receive data storage element. For example, a LFSR may be used to produce a repeating pattern signal having a data length (e.g., a number of bits produced as the repeating pattern signal before the repeating pattern signal begins repeating) much greater than the data capacity of the receive data storage element (e.g., the number of bits that can be stored in the receive data storage element).

The comparison circuit 113 serves as a comparison element, performing a comparison of a relationship between the repeating pattern signal and the receive data input signal received at the receive data input to produce a comparison output signal based on the comparison when the receive circuit 103 is operating in the test mode.

As with the transmit data storage element, the receive data storage element may be divided into receive data storage sub-elements (e.g., pipeline structures) during operation in the normal mode. Thus, distinct data are passed through each of the plurality of sub-elements when the receive circuit is operating in the normal mode. The receive data storage sub-elements may be united into a single unit in the form of the receive data storage element for providing the repeating pattern signal when the receive circuit is operating in the test mode.

The receive data storage element may be loaded from the receive data input to initialize the test mode from a source other than the receive data input, for example, the receive data storage element may be loaded via a parallel receive load input.

Figure 2:
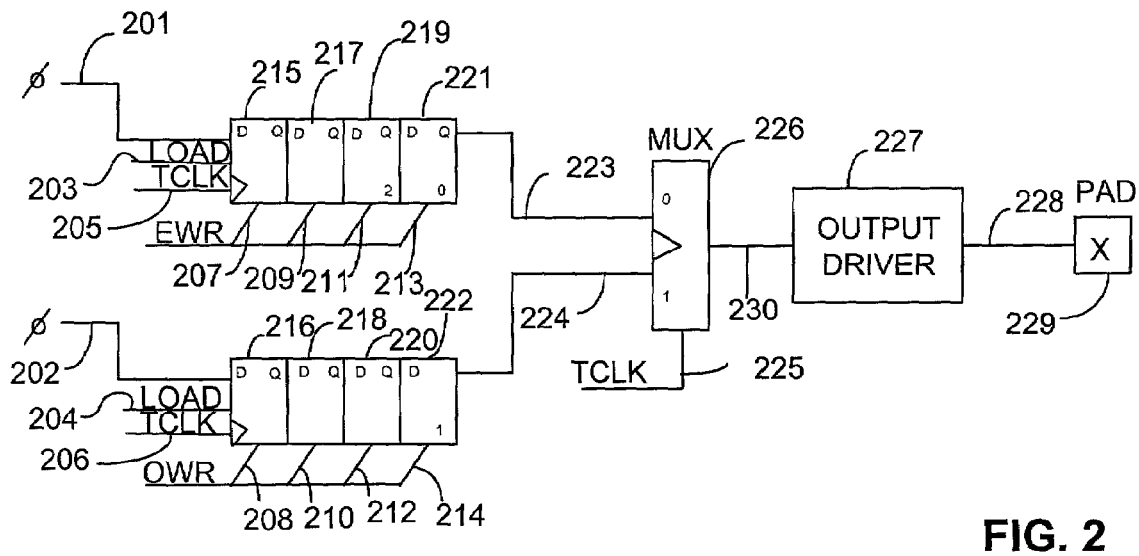
FIG. 2 is a logic diagram illustrating a prior art transmit circuit.
Figure 3:
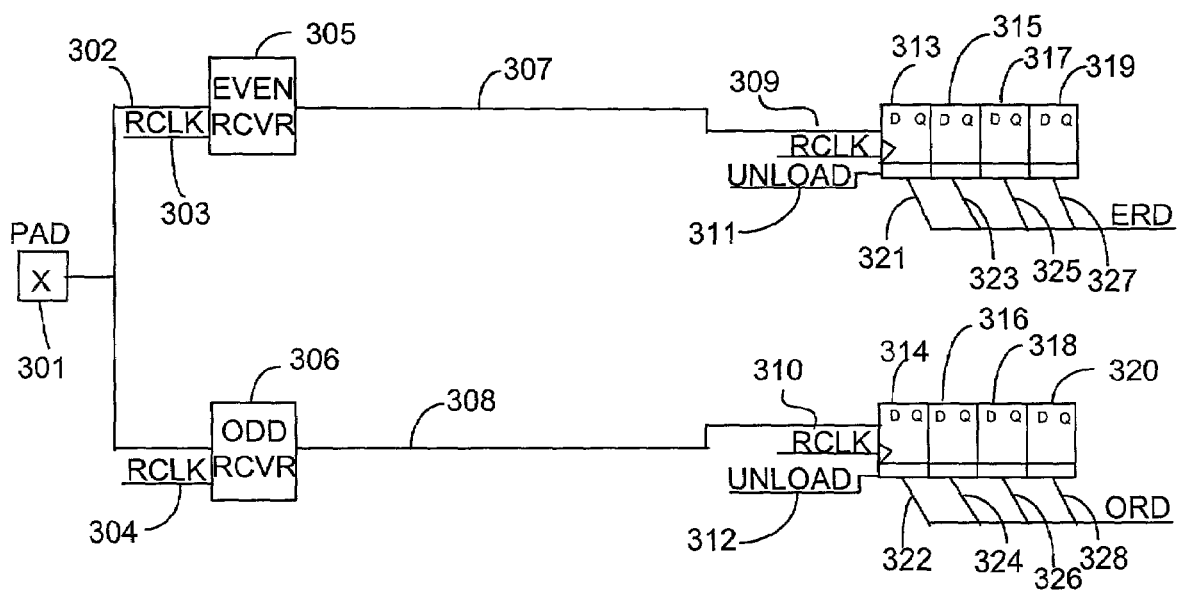
FIG. 3 is a logic diagram illustrating a prior art receive circuit.

An embodiment of the invention may be implemented in a manner so as not to be incompatible with an existing transmit circuit, for example, the transmit circuit of FIG. 2, and/or an existing receive circuit, for example, the receive circuit of FIG. 3. Such implementation of an embodiment of the invention can be used to overcome the disadvantages of the existing circuits.

Figure 14:
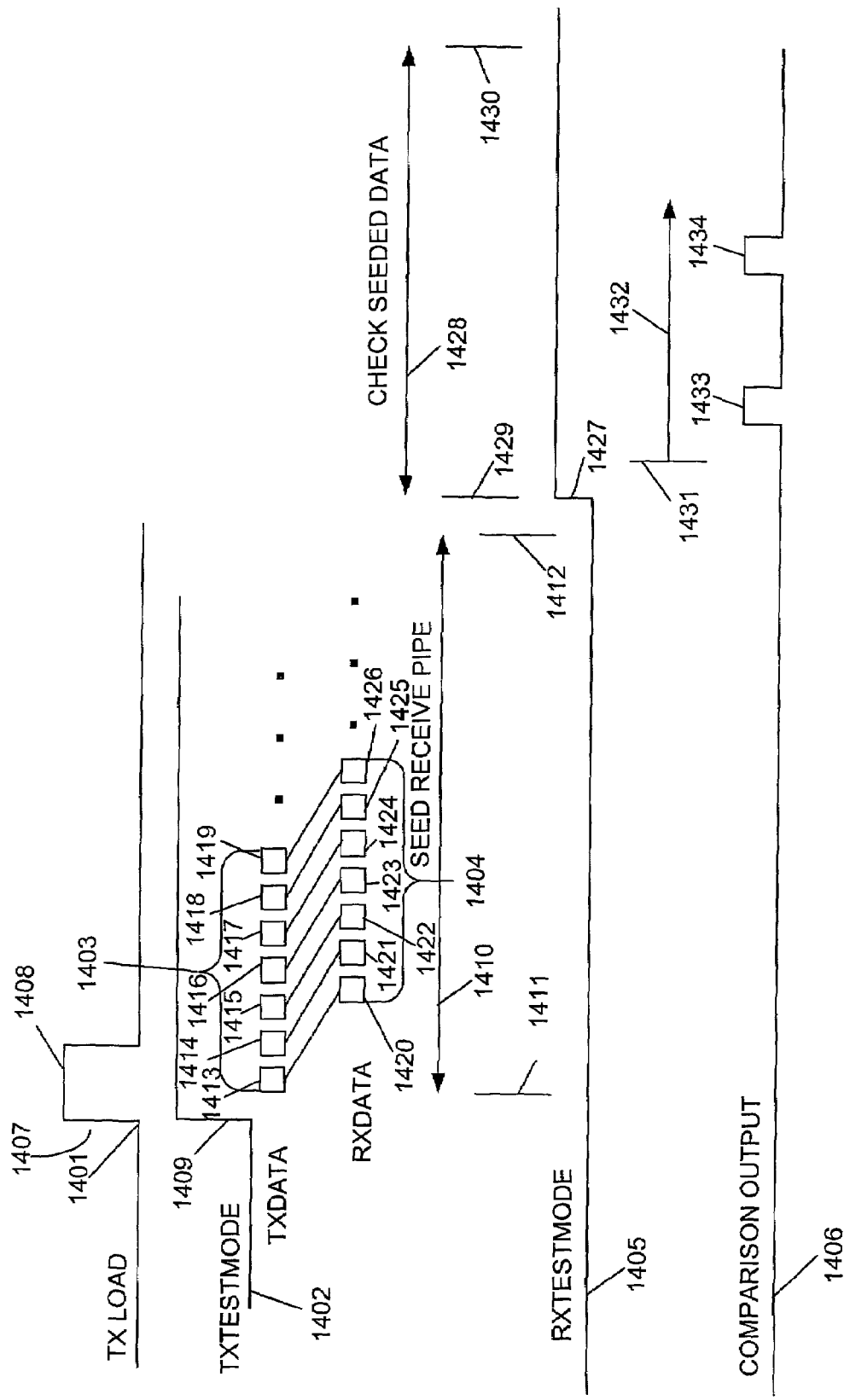
FIG. 14 is a timing diagram illustrating signals in accordance with an embodiment of the invention.

FIG. 14 is a timing diagram illustrating signals in accordance with an embodiment of the invention. A transmit circuit load signal 1401, a transmit circuit test mode signal 1402, a receive circuit test mode signal 1405, and a comparison output signal 1406 are illustrated. A plurality of transmit circuit data 1403 and a plurality of receive circuit data 1404 are also illustrated.

A PRBS test mode is entered upon the assertion 1409 of the transmit circuit test mode signal 1402. Data are loaded into a shift register in the transmit circuit on the rising edge 1407 of pulse 1408 of the transmit circuit load signal 1401. Sufficient transmit circuit data 1403 to initialize the transmit circuit and the receive circuit to like states is communicated from the transmit circuit to the receive circuit, where it appears as receive circuit data 1404. Bits 1413, 1414, 1415, 1416, 1417, 1418, and 1419 of transmit circuit data 1403 are communicated to provide bits 1420, 1421, 1422, 1423, 1424, 1425, and 1426 of receive circuit data 1404 respectively. These data are communicated between time 1411 and time 1412, during period 1410, and serves to seed the receive circuit with appropriate data.

Once sufficient data has been communicated between the transmit circuit and the receive circuit, receive circuit test mode signal 1405 is asserted at assertion 1427. Then, between time 1429 and time 1430, during period 1428, testing may be performed using the seeded receive circuit data. If, during the testing, an element of transmit circuit data being transmitted to the receive circuit does not match a corresponding element of receive circuit data, comparison output signal 1406 is asserted, such as occurs at assertions 1433 and 1434, which occur during period 1432 after time 1431. When testing is completed, the system may be returned to its normal mode by deasserting the transmit circuit test mode signal 1402 and the receive circuit test mode signal 1405.

In a transmit circuit capable of a PRBS test mode, a PRBS test signal of the transmit circuit may be asserted to serve as the transmit circuit test mode signal 1402. In a transmit circuit capable of a roll test mode, a roll test signal of the transmit circuit may be asserted to serve as the transmit circuit test mode signal 1402. In a receive circuit capable of a PRBS test mode, a PRBS test signal of the receive circuit may be asserted to serve as the receive circuit test mode signal 1405. In a receive circuit capable of a roll test mode, a roll test signal of the receive circuit may be asserted to serve as the receive circuit test mode signal 1405.

Figure 15:
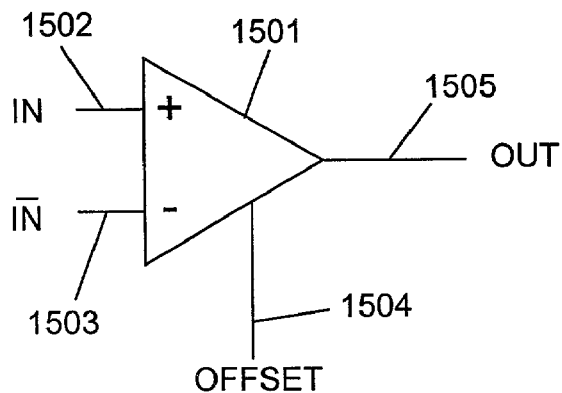
FIG. 15 is a block diagram illustrating a differential receiver that may be used in conjunction with and embodiment of the invention.

FIG. 15 is a block diagram illustrating a differential receiver that may be used in conjunction with and embodiment of the invention. Differential receiver 1501 comprises a non-inverting input 1502, an inverting input 1503, an offset input 1504, and an output 1505. Offset input 1504 may be implemented in various ways, for example, as a single-ended input or a differential input.

Figure 16:
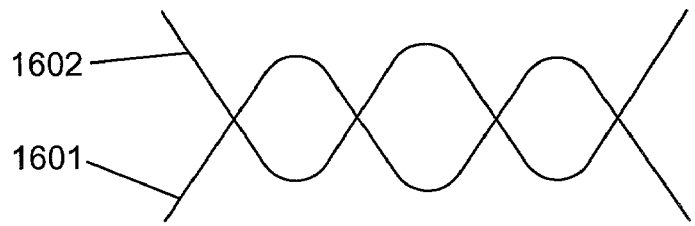
FIG. 16 is a waveform diagram illustrating a differential signal that may be used in conjunction with an embodiment of the invention.

FIG. 16 is a waveform diagram illustrating a differential signal that may be used in conjunction with an embodiment of the invention. The differential signal comprises a signal 1601 and its complementary signal 1602.

Figure 17:
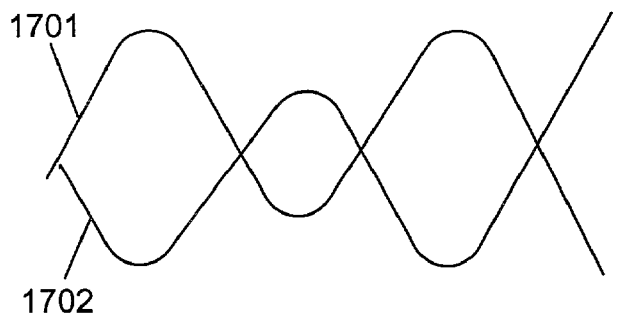
FIG. 17 is a waveform diagram illustrating a differential signal that may be used in conjunction with an embodiment of the invention.

FIG. 17 is a waveform diagram illustrating a differential signal that may be used in conjunction with an embodiment of the invention. The differential signal comprises a signal 1701 and its complementary signal 1702. The signal 1701 and its complementary signal 1702 have been shifted slightly relative to each other, for example through the use of offset input 1504 of FIG. 15.

Figure 18:
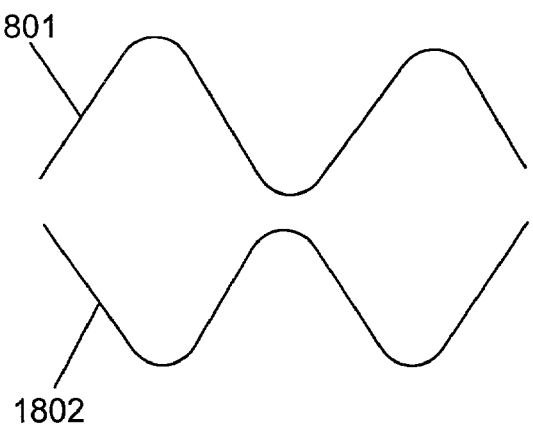
FIG. 18 is a waveform diagram illustrating a differential signal that may be used in conjunction with an embodiment of the invention.

FIG. 18 is a waveform diagram illustrating a differential signal that may be used in conjunction with an embodiment of the invention. The differential signal comprises a signal 1801 and its complementary signal 1802. The signal 1801 and its complementary signal 1802 have been shifted substantially relative to each other, for example through the use of offset input 1504 of FIG. 15.

Figure 19:
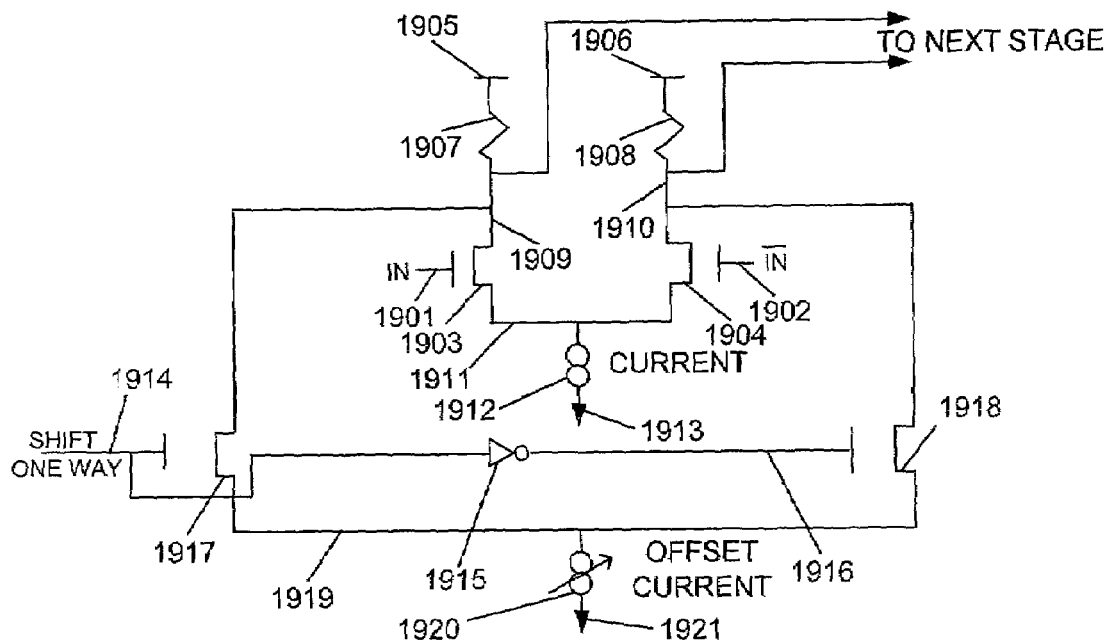
FIG. 19 is a schematic diagram illustrating an example of an input stage of an offsetable differential receiver in accordance with an embodiment of the invention.

FIG. 19 is a schematic diagram illustrating an example of an input stage of an offsetable differential receiver in accordance with an embodiment of the invention. A differential input signal is coupled to an input 1901 at a gate of a first input transistor 1903 and to an input 1902 at a gate of a second input transistor 1904. A source of the first input transistor 1903 and a source of the second input transistor 1904 are coupled to a first terminal 1911 of current source 1192. A second terminal 1913 of current source 1912 is coupled to ground.

A drain of the first input transistor 1903 is coupled to the drain of transistor 1917, to a first terminal of resistor 1907, and to a first output. A drain of the second input transistor 1904 is coupled to the drain of transistor 1918, to a first terminal of resistor 1908, and to a second output. The second end of the first resistor is coupled to a voltage reference 1905. The second end of the second resistor is coupled to a voltage reference 1906. The sources of transistors 1917 and 1918 are coupled to a first terminal 1919 of a variable current source 1920. The second terminal 1921 of variable current source 1920 is coupled to ground.

A shifting input signal 1914 is applied to the gate of transistor 1917. The shifting input signal 1914 is inverted by inverter 1915 and applied to the gate terminal 1916 of transistor 1918.

Figure 20:
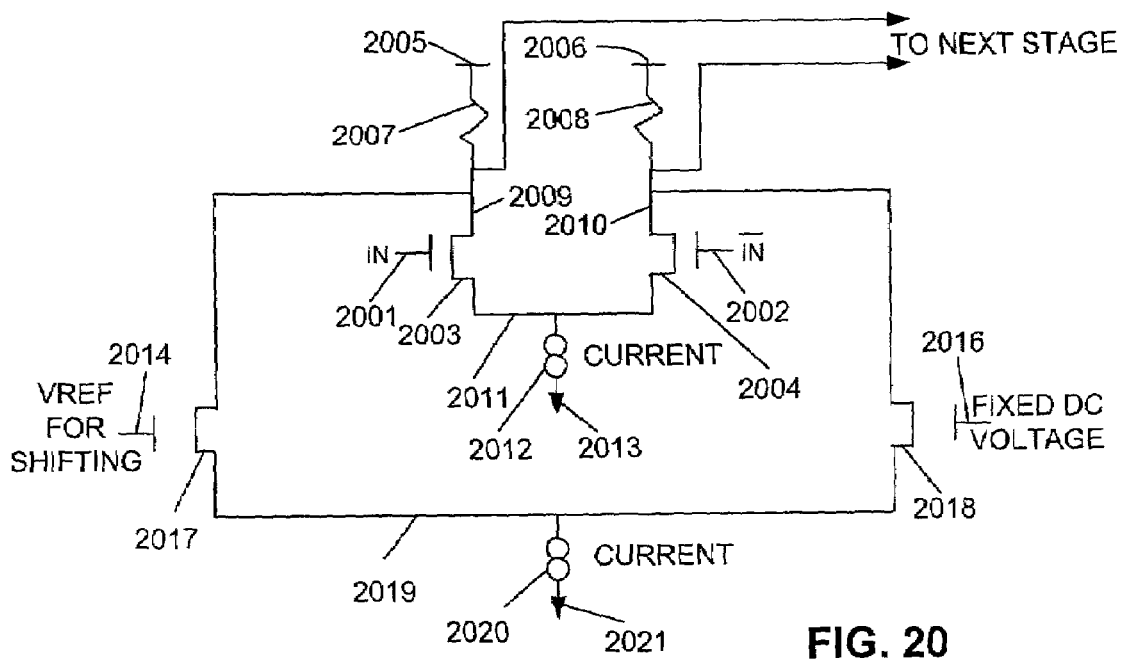
FIG. 20 is a schematic diagram illustrating an example of an input stage of an offsetable differential receiver in accordance with an embodiment of the invention.

FIG. 20 is a schematic diagram illustrating an example of an input stage of an offsetable differential receiver in accordance with an embodiment of the invention. A differential input signal is coupled to an input 2001 at a gate of a first input transistor 2003 and to an input 2002 at a gate of a second input transistor 2004. A source of the first input transistor 2003 and a source of the second input transistor 2004 are coupled to a first terminal 2011 of current source 2012. A second terminal 2013 of current source 2012 is coupled to ground.

A drain of the first input transistor 2003 is coupled to the drain of transistor 2017, to a first terminal of resistor 2007, and to a first output. A drain of the second input transistor 2004 is coupled to the drain of transistor 2018, to a first terminal of resistor 2008, and to a second output. The second end of the first resistor is coupled to a voltage reference 2005. The second end of the second resistor is coupled to a voltage reference 2006. The sources of transistors 2017 and 2018 are coupled to a first terminal 2019 of a current source 2020. The second terminal 2021 of current source 2020 is coupled to ground. A shifting input signal 2014 is applied to the gate of transistor 2017. A fixed DC voltage 2016 is applied to the gate terminal of transistor 2018. Alternatively, a variable signal, such as a variable voltage, may be applied to the gate terminal of transistor 2018. As one example, the variable signal at the gate terminal of transistor 2018 may vary complementary to the shifting input signal 2014. This would allow, for example, a differential signal to be used to control the offset. Alternatively, the signal at the gate terminal of transistor 2018 may vary independent of the shifting input signal 2014.

Figure 21:
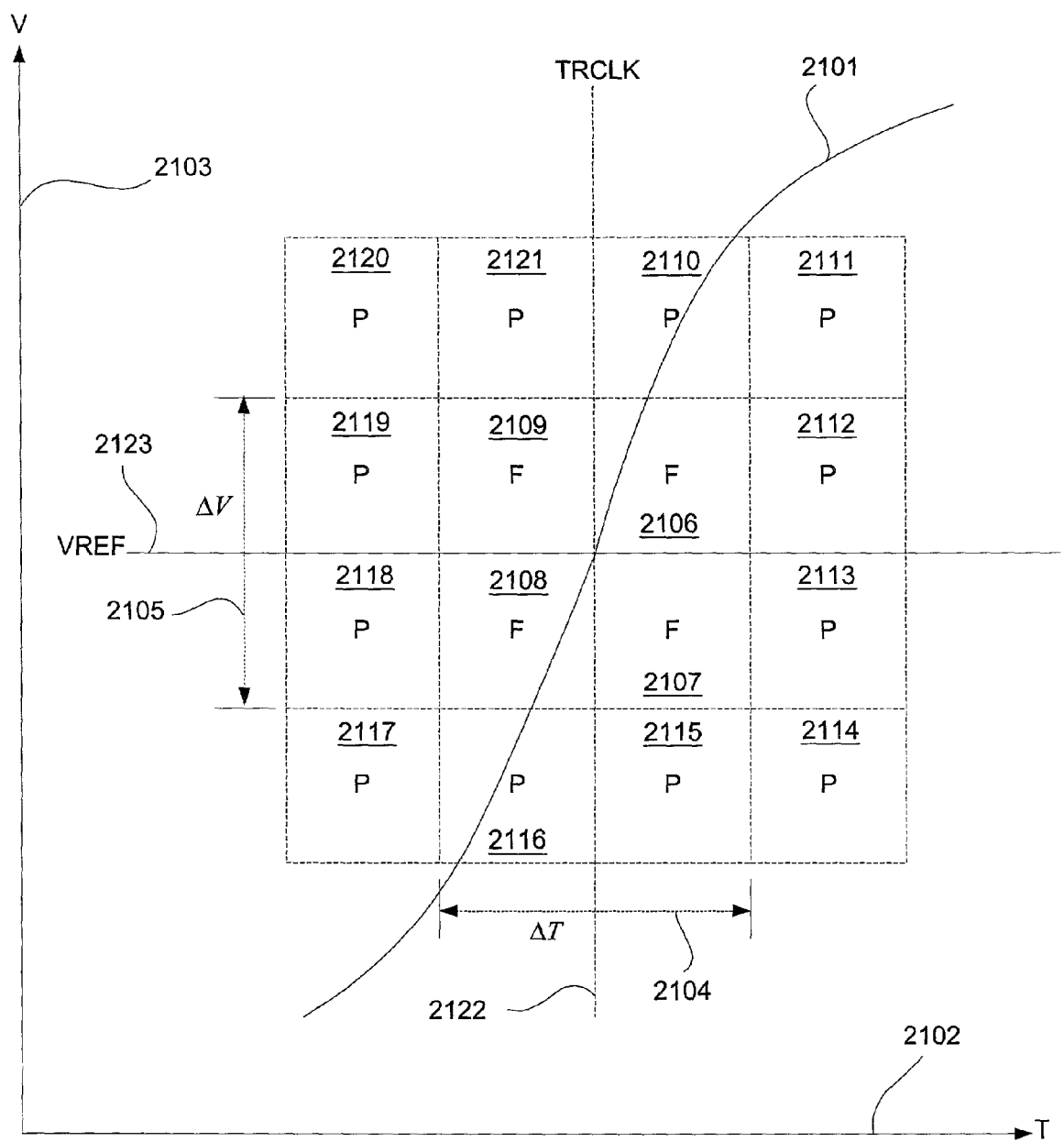
FIG. 21 is a two-dimensional graphical diagram illustrating a relationship between a waveform of a signal received at the receive circuit and variations occurring in the interpretation of data represented by the signal in accordance with an embodiment of the invention.

FIG. 21 is a two-dimensional graphical diagram illustrating a relationship between a waveform of a signal received at the receive circuit and variations occurring in the interpretation of data represented by the signal in accordance with an embodiment of the invention. Waveform 2101 plots a portion of the signal received at the receive circuit against a time axis 2102 and a voltage axis 2103. If the parameters of the system are adjusted so that sampling occurs at time 2122 with a sampling time requirement $\Delta T$ spanning range 2104 with a voltage threshold set at voltage reference 2123 with a voltage overdrive requirement of $\Delta V$ spanning range 2105, then if waveform 2101 passes through regions 2106–2109, repeatability of data extracted from the signal within those regions is not guaranteed, so variations can be expected to occur between iterations of waveform 2101 passing through these regions. However, if waveform 2101 passes through regions 2110–2121, accurate data can be reliably extracted from waveform 2101. Thus, repeatability of the data occurs within these regions, and variations are not detected within these regions.

By observing the variations occurring within regions 2106–2109, information representative of the locations of regions 2106–2109 can be stored. Then, the positions of time 2122 and voltage reference 2123 within the plane formed by time axis 2102 and voltage axis 2103 are adjusted, and variations in extracted data are observed for samples taken within the adjusted ranges 2104 and 2105 corresponding to the adjusted positions of time 2122 and voltage reference 2123. Information representative of locations of regions where variation is observed for these adjusted positions is then stored. By cumulatively storing this information over several iterations of this process, a representation of waveform 2101 can be displayed based on the information. To make the representation of waveform 2101 a closer approximation of the actual waveform 2101, interpolation between the locations where variations are observed can be performed. Such interpolation can be explicitly performed or allowed to occur during visualization of the representation of waveform 2101, utilizing the same visual effects that allow images of discrete elements, such as dot matrix displays or bit-mapped images, to appear as though the discrete elements are merged into a larger element.

When ranges 2104 and 2105 are very small, variations may be observed in only a single region for each iteration of positions of time 2122 and voltage reference 2123. In that case, the accumulation of locations of regions where variations are observed yields a thin and precise representation of waveform 2101. However, when ranges 2104 and 2105 are larger, variations may be observed over the several regions lying within the ranges 2104 and 2105. Thus, a thicker representation of waveform 2101 results, allowing the broader area of the plane over which variations in extracted data occur to be observed.

Figure 22:
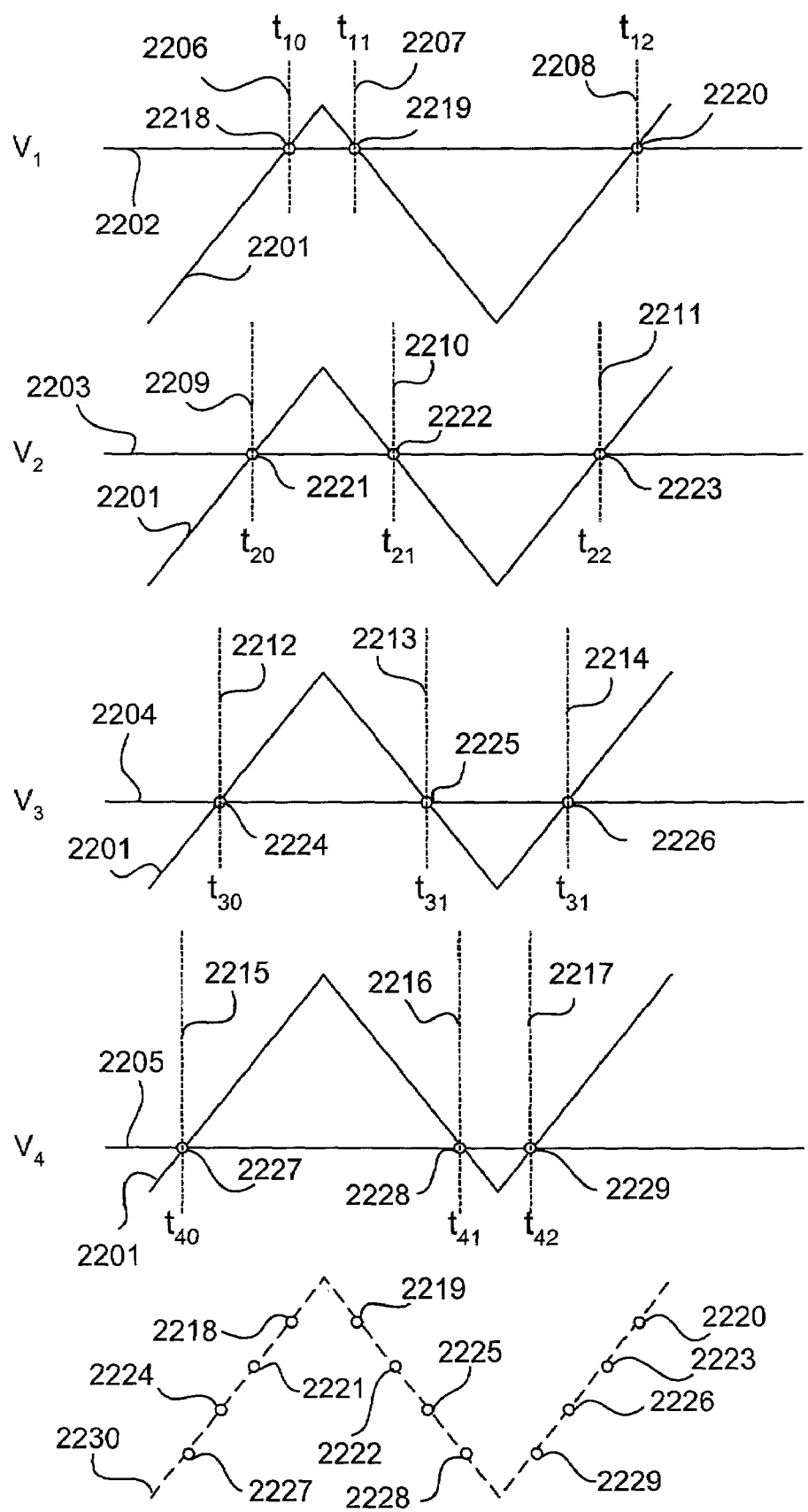
FIG. 22 is a two-dimensional graphical diagram illustrating the accumulation of locations of regions where variations are observed in accordance with an embodiment of the invention.

FIG. 22 is a two-dimensional graphical diagram illustrating the accumulation of locations of regions where variations are observed in accordance with an embodiment of the invention. As an example, waveform 2201 is illustrated as a triangle wave, but it should be understood that waveform 2201 may be of any arbitrary shape. Waveform 2202 is illustrated as being sampled according to parameters that affect the extraction of data from waveform 2201. In the example at the top of FIG. 22, waveform 2201 is illustrated as being sampled according to a voltage reference 2202 and times 2206, 2207, and 2208, yielding points 2218, 2219, and 2220, respectively, representative of the locations of regions where variations in extracted data occur, as discussed above in detail with reference to FIG. 21. It should be understood that sampling can also occur at any other times along waveform 2201, but that the lack of variation of data of such samples allows those samples to be disregarded when it is desired to identify locations corresponding to regions where variations in the data occur. Also, by sampling waveform 2202 according to a DC voltage reference, a waveform 2201 derived from a single-ended signal (e.g., a signal that may be communicated over a single conductor with reference to a reference potential, such as ground) may be sampled. However, it should be noted that embodiments of the invention may be used for waveforms other than those derived from a single-ended signal, for example, those derived from a differential signal, as described below with reference to FIG. 23.

In the next example of FIG. 22, waveform 2201 is illustrated as being sampled according to a voltage reference 2203 and times 2209, 2210, and 2211, yielding points 2221, 2222, and 2223, respectively, representative of the locations of regions where variations in extracted data occur for these adjusted parameter values. In the next example, waveform 2201 is illustrated as being sampled according to a voltage reference 2204 and times 2212, 2213, 2214, yielding points 2224, 2225, and 2226, respectively. In the next example, waveform 2201 is illustrated as being sampled according to a voltage reference 2205 and times 2215, 2216, and 2217, yielding points 2227, 2228, and 2229.

By accumulating points 2218–2229 and plotting them according to the voltage references and times pertaining to their respective sampling, an approximation 2230 of waveform 2201 can be obtained, as illustrated near the bottom of FIG. 22. Continuity of the approximation 2230 of waveform 2201 can be obtained by interpolating between points 2218–2229, as illustrated by the dashed line of approximation 2230, or by allowing such continuity to be perceived when the plotted accumulation of points 2218–2229 is visualized.

Figure 23:
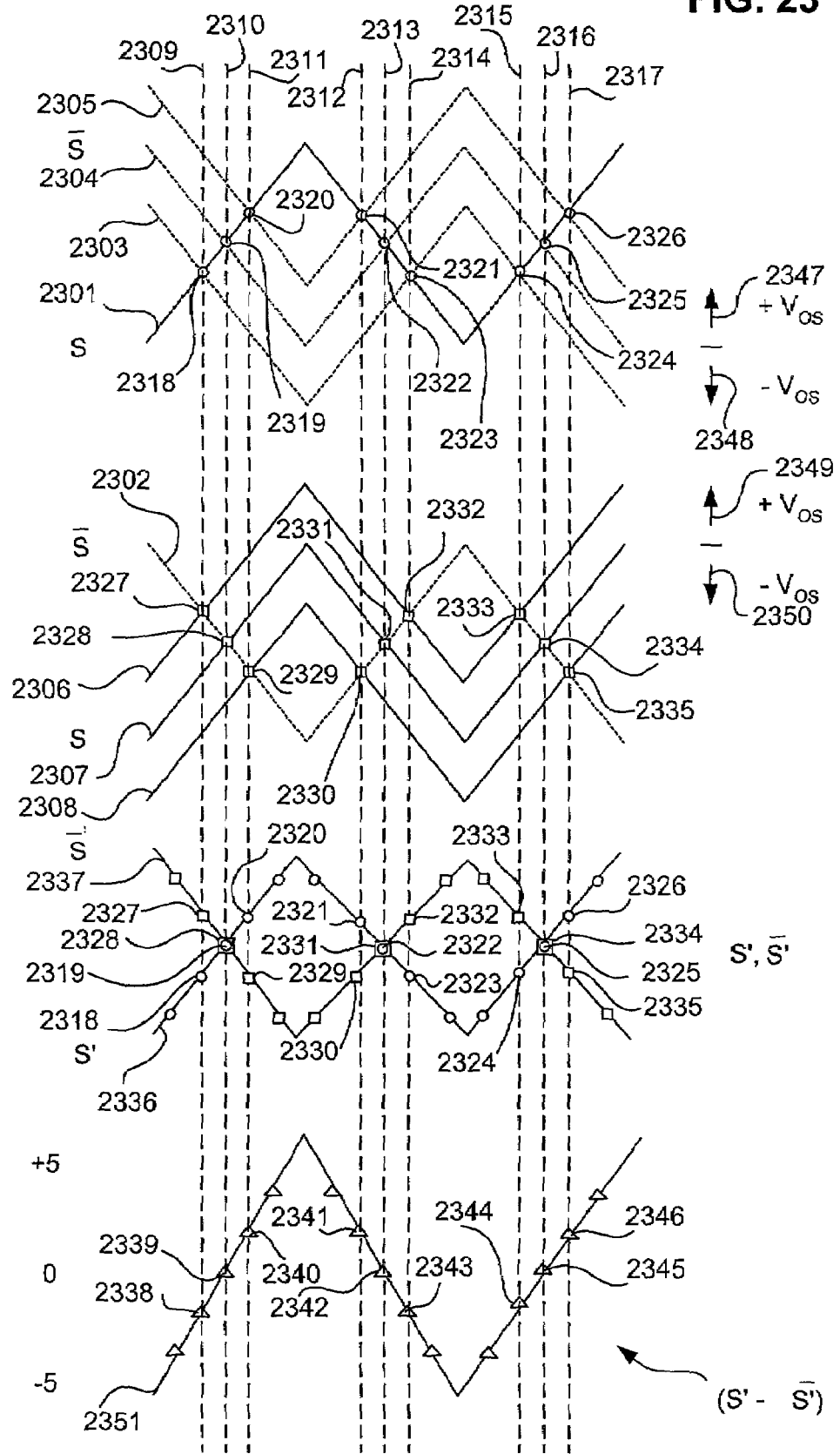
FIG. 23 is a two-dimensional graphical diagram illustrating the accumulation of locations of regions where variations are observed based on sampling pertaining to a differential signal in accordance with an embodiment of the invention.

FIG. 23 is a two-dimensional graphical diagram illustrating the accumulation of locations of regions where variations are observed based on sampling pertaining to a differential signal in accordance with an embodiment of the invention. A differential signal involves a complimentary relationship between a first signal on a first conductor to a second signal on a second conductor. As with FIG. 22, an exemplary triangle waveform is illustrated in FIG. 23, but it should be understood that the technique described with reference to FIG. 23 may be applied to any arbitrary waveform.

In the example illustrated at the top of FIG. 23, the first signal is represented by waveform 2301. The second signal is represented by waveform 2304. In this example, waveform 2304 is used as a reference to which waveform 2301 is compared. By sampling waveform 2301 relative to waveform 2304 at times 2310, 2313, and 2316 in accordance with the technique described above with reference to FIG. 21, points 2319, 2322, and 2325, respectively, are identified. By shifting waveform 2304 by an offset 2347, as illustrated by waveform 2305, and sampling waveform 2301 at times 2311, 2312, and 2317, points 2320, 2321, and 2326, respectively, are identified. By shifting waveform 2304 by an offset 2348, as illustrated by waveform 2303, and sampling waveform 2301 at times 2309, 2314, and 2315, points 2318, 2323, and 2324, respectively, are identified.

In addition to identifying points 2318–2326 by sampling waveform 2301 relative to waveforms 2303–2305, another set of points 2327–2335 can be identified by sampling waveform 2302 using waveform 2307 as a reference. In this case, the first signal is represented by waveform 2307, and the second signal is represented by waveform 2302. By sampling waveform 2302 relative to waveform 2307 at times 2310, 2313, and 2316, points 2328, 2331, and 2234, respectively, are identified. By shifting waveform 2307 by an offset 2349, as illustrated by waveform 2306, and sampling waveform 2302 at times 2309, 2314, and 2315, points 2327, 2332, and 2333, respectively, are identified. By shifting waveform 2307 by an offset 2350, as illustrated by waveform 2308, and sampling waveform 2302 at times 2311, 2312, and 2317, points 2329, 2330, and 2335, respectively, are identified.

Thus, according to the times and offset shifts (or lack thereof) used for identifying points 2318–2335, points 2318–2335 can be plotted to yield approximations 2336 and 2337 of the waveforms corresponding to the first signal and the second signal, respectively, as illustrated in FIG. 23. To obtain an approximation of the differential waveform corresponding to the differential signal, the approximation 2337 corresponding to the second signal is subtracted from the approximation 2336 corresponding to the first signal, thereby yielding approximation 2351 corresponding to the differential signal. As can be seen, points 2338–2346 result from subtracting the locations of points 2327–2335 from the locations of points 2318–2326. Depending on the resolution of points 2338–2346, the apparent continuity of approximation 2351 may be obtained by interpolating between points 2338–2346 or by allowing such continuity to be perceived when the plotted accumulation of points 2338–2346 is visualized.

Figure 24A:
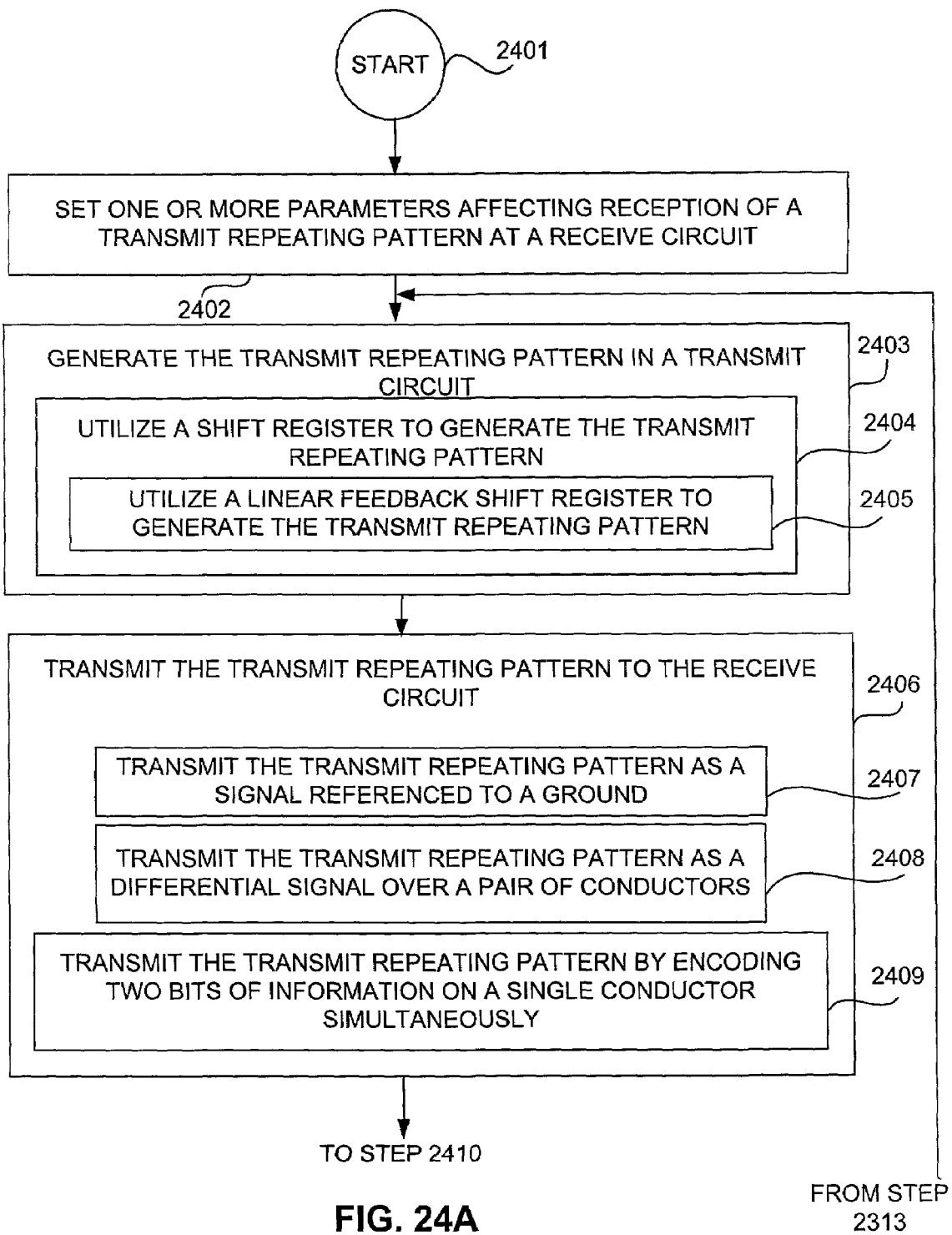
FIGS. 24A and 24B are a flow diagram illustrating a method in accordance with an embodiment of the invention.
Figure 24B:
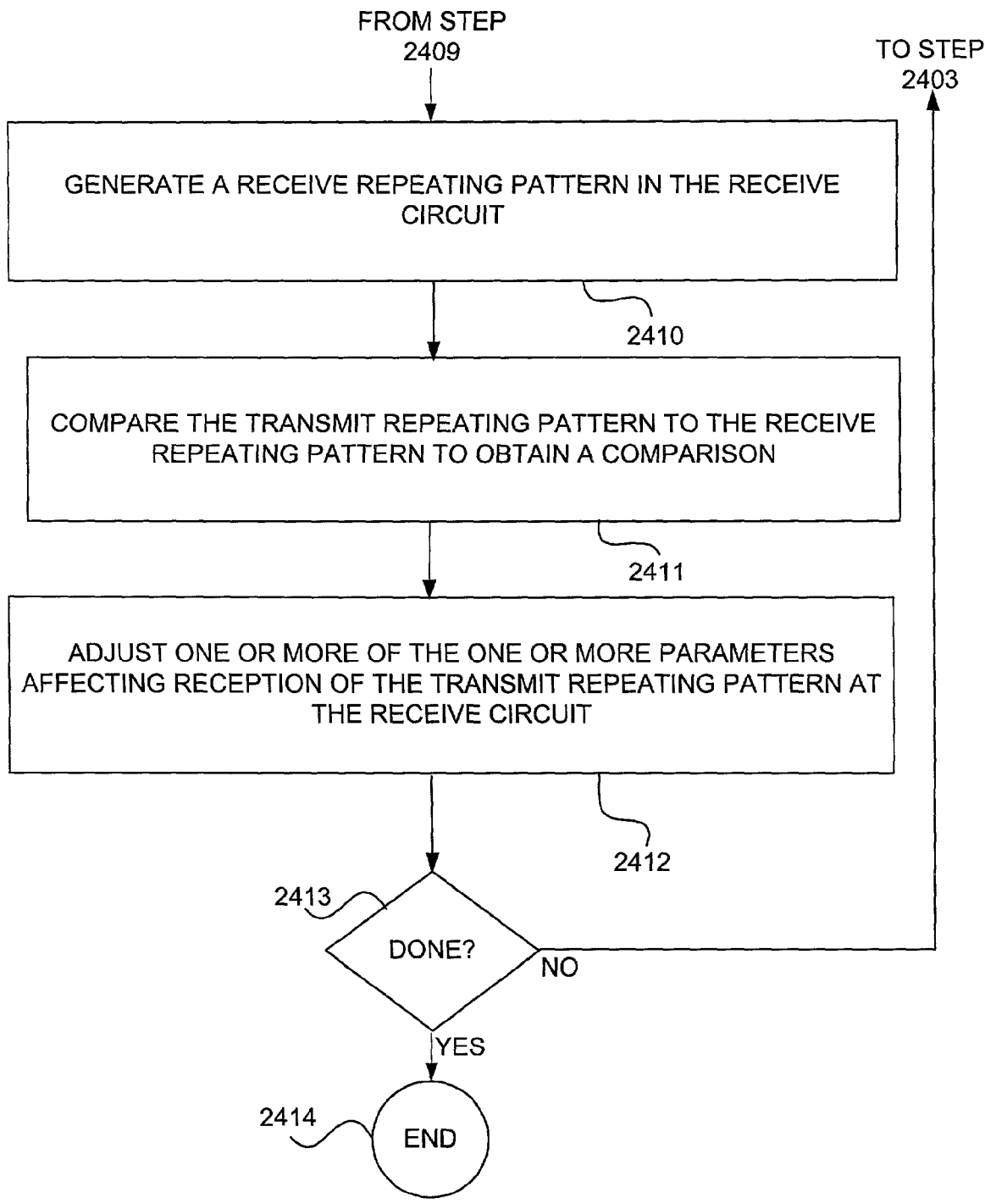

FIGS. 24A and 24B are a flow diagram illustrating a method in accordance with an embodiment of the invention. The method begins in step 2401. In step 2402, one or more parameters affecting reception of a transmit repeating pattern at a receive circuit are set. For example, a timing parameter, such as a timing parameter of a transmit circuit and/or a timing parameter of the receive circuit, and/or an amplitude parameter, such as a voltage parameter influencing voltages of logic levels for transmitting a transmit repeating pattern to the receive circuit and/or a voltage parameter influencing the ability to distinguish such logic levels in the receive circuit, may be set. In step 2403, the transmit repeating pattern is generated in a transmit circuit. Step 2403 may include step 2404. In step 2404, a shift register may be utilized to generate the transmit repeating pattern. Step 2404 may include step 2405. In step 2405, a linear feedback shift register (LFSR) may be utilized to generate the transmit repeating pattern.

From step 2403, the method continues to step 2406. In step 2406, a transmit repeating pattern is transmitted to the receive circuit. Step 2406 may include steps 2407, 2408, and/or 2409. In step 2407, the transmit repeating pattern is transmitted as a signal referenced to a ground. In step 2408, the transmit repeating pattern is transmitted as a differential signal over a pair of conductors. In step 2409, the transmit repeating pattern is transmitted by encoding two bits of information on a single conductor simultaneously. From step 2406, the method continues to step 2410. In step 2410, a receive repeating pattern is generated in the receive circuit. From step 2410, the method continues to step 2411. In step 2411, the transmit repeating pattern is compared to the receive repeating pattern to obtain a comparison. From step 2411, the method continues to step 2412. In step 2412, one or more of the one or more parameters affecting reception of the transmit repeating pattern at the receive circuit are adjusted. For example, parameters affecting the relative position of the transmit repeating pattern with respect to a voltage reference or timing reference of the receive circuit may be adjusted. Such adjustments may be made in the transmit circuit, the receive circuit, or both. From step 2412, the method continues to step 2413, where a decision is made as to whether or not the process is done. If the process is done, the method continues to step 2414, where it ends. If the process is not done, the method returns to step 2403 and performs one or more additional iterations, allowing the effects of adjustments performed in step 2412 to be assessed and further optimization to occur. Such iterations may continue to occur without limit. As an example, the iterations may continue with the adjustments performed over one or more ranges of the one or more parameters to assess characteristics over the one or more ranges of the one or more parameters. For example, by adjusting a voltage and/or timing offset parameter of the receive circuit, information can be obtained in the reiteration of step 2411. Such information can be expressed in a coordinate system, such as a Cartesian coordinate system, and used to plot a waveform representing the transmit repeating pattern as received at the receive circuit, for example, to provide in-situ "virtual oscilloscope" capability. A representation of a waveform may be constructed based on the comparison performed in step 2411.

While a transmit clock for a transmit circuit and a receive clock for a receive circuit may operate at the same frequency (or approximately the same frequency), the transmit clock and the receive clock may be set to operate at frequencies that are multiple or submultiples of one another (or at frequencies that approximate such frequencies). If the frequencies are equal, an eye diagram such as that illustrated in FIG. 25 can result. The eye diagram results from the effective "folding" of the representation of the waveform, which results in overlapping display of samples obtained from different cycles of the waveform. While such overlapping is useful in some circumstances, allowing observation of changes in the waveform between different cycles, such overlapping can sometimes obscure details of the representation of the waveform that are meaningful.

It is possible to effectively "unfold" the representation of the waveform so as to allow observation of the waveform (or a portion thereof) in detail. Such "unfolding" may be achieved by controlling the frequency relationship between the transmit clock and the receive clock. For example, by setting the receive clock to operate slower than the transmit clock, the representation of the waveform may be displayed in greater detail.

Evaluation of a signaling system using repeating patterns may be performed over one medium, for example, one conductor, with the results of the evaluation used to adjust one or more parameters affecting communication over that one medium. Alternatively, if several media, for example, several conductors, may be characterized as providing similar performance and are similarly affected by changes to the parameters that relate to them, for example, in a closely-coupled bus system, evaluation may be performed on one medium, with the results of the evaluation applied to the adjustment of one or more parameters affecting some or all of the several media.

As an example, an embodiment of the invention may be applied to a memory device or a memory system. Media such as a data line, an address line, and/or a control line may be evaluated. Based on the results of such evaluation, parameters affecting that data line, address line, and/or control line and/or others similar to them may be adjusted. Thus, a common medium may be used for evaluation and subject to effects of parameter adjustment. Alternatively, a medium may be subject to effects of parameter adjustment based on evaluation involving another medium, namely an analysis medium. Thus, for example, a parameter may be adjusted that affects reception of a second receive data input signal, the second receive data input signal being distinct from a receive data input signal, while that parameter may or may not affect reception of the receive data input signal.

As one example of an embodiment of the invention, multiple evaluations may be performed for one transmit circuit coupled to multiple receive circuits, potentially yielding multiple adjustments of one or more parameters. Likewise, multiple evaluations may be performed for one receive circuit coupled to multiple transmit circuit, potentially yielding multiple adjustments of one or more parameters. As an example, in a memory system comprising multiple memory devices, a memory controller may perform separate evaluations for some or all of the multiple memory devices and use separate parameters to optimize communication with the multiple memory devices.

Evaluation of a signaling system may be performed at many different times. For example, evaluation may performed during a manufacturing process, at system start-up, when a communication failure is detected, or during normal operation of a signaling system. Evaluation may be performed occasionally between periods of communication of user data between the transmit circuit and the receive circuit. As an example of evaluation at system start-up, evaluation may be performed before the system is operating normally and ready to communicate user data.

While the transmit circuit and the receive circuit may be contained within a signaling system being evaluated, either the transmit circuit or the receive circuit may be provided externally. For example, a transmit circuit may be evaluated using an external receive circuit, or a receive circuit may be evaluated using an external transmit circuit. In one example, such external circuits may be provided in a manufacturing environment to evaluate signaling systems during their manufacturing process.

Figure 25:
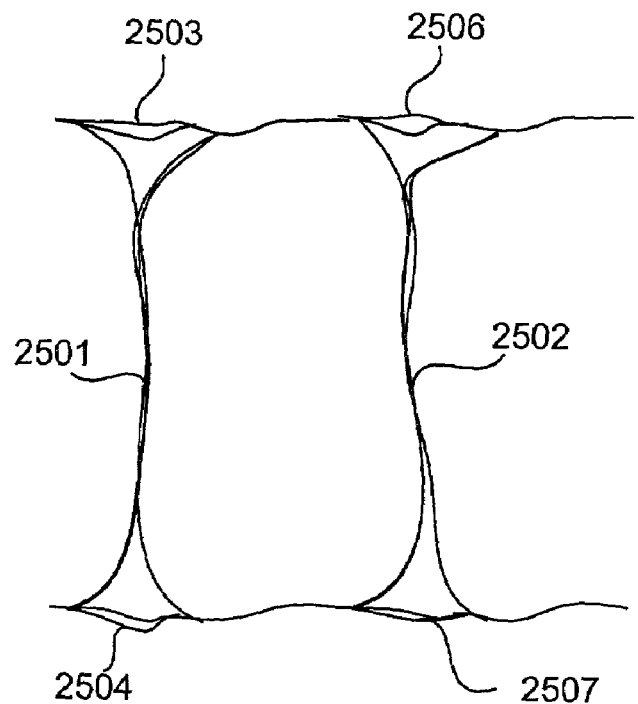
FIG. 25 is a waveform diagram illustrating an example of a persistent display of overlapping samples of a waveform in accordance with an embodiment of the invention.

FIG. 25 is a waveform diagram illustrating an example of a persistent display of overlapping samples of a waveform in accordance with an embodiment of the invention. In this diagram, the transmit clock is operated at a slower frequency than the receive clock (in this example, one fourth the receive clock frequency). In this example, a transmit repeating pattern of 1111 0000 1111 0000 is used. As can be seen, multiple cycles overlap, resulting in edges 2501 and 2502, which represent rising edges for some cycles and falling edges for other cycles. As can be seen from levels 2503 and 2504, for some cycles, no transition occurred at the time corresponding to edge 2501. As can be seen from levels 2506 and 2507, for some cycles, no transition occurred at the time corresponding to edge 2502. While such information is useful under some circumstances, it can obscure desired details under other circumstances.

Figure 26:
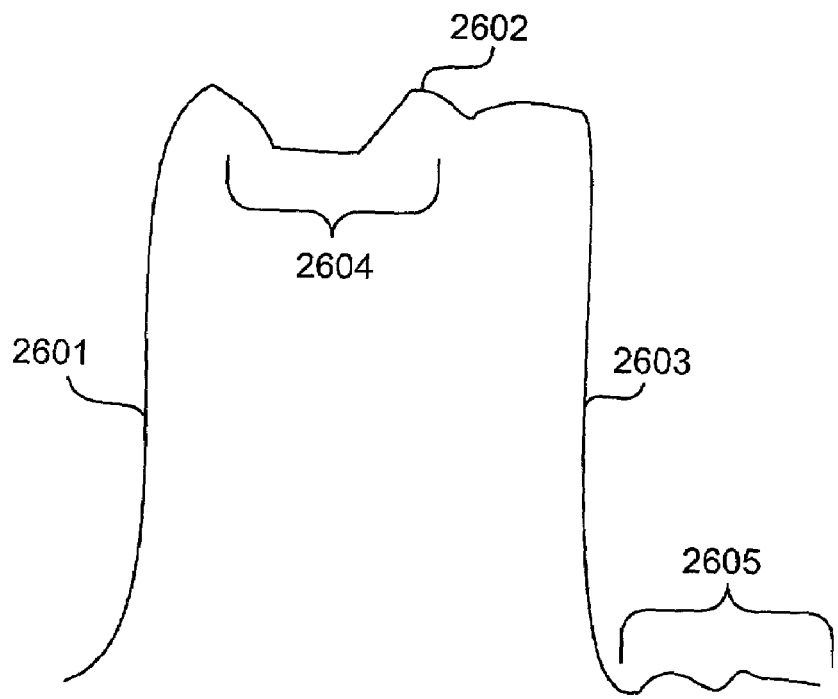
FIG. 26 is a waveform diagram illustrating an example of a display of samples of a waveform in accordance with an embodiment of the invention.

FIG. 26 is a waveform diagram illustrating an example of a display of samples of a waveform in accordance with an embodiment of the invention. In this diagram, the transmit clock is operated at a higher frequency than the receive clock (in this example, four times the receive clock frequency). In this example, a transmit repeating pattern of 1111 0000 1111 0000 is used. As can be seen, greater detail of the waveform can be observed, as rising edge 2601 is clearly visible, not overlapping with a falling edge, and falling edge 2603 is clearly visible, not overlapping with a rising edge. High level 2602 is clearly visible, not overlapping with cycles lacking rising edge 2601. Consequently, ringing effect 2604 can be observed in detail. Likewise, ringing effect 2605 can be observed in detail.

A display of samples of a waveform such as that illustrated in FIG. 26 is useful for observing the step response of a signaling system. The step response is a characterization of how a system is affected by a signal having a rapid transition from one level to another. In the example of FIG. 26, a rapid transition from a low level to a high level 2602 occurs at rising edge 2601. The ringing effect 2604 is associated with the step response of the system. Thus, to observe a step response of a system, a signal having a rapid transition from one level to another may be applied to the system and the resulting system behavior observed. Embodiments of the invention may be used to observe such system behavior. Awareness of the step response of a system can be readily used for system optimization.

Figure 27:
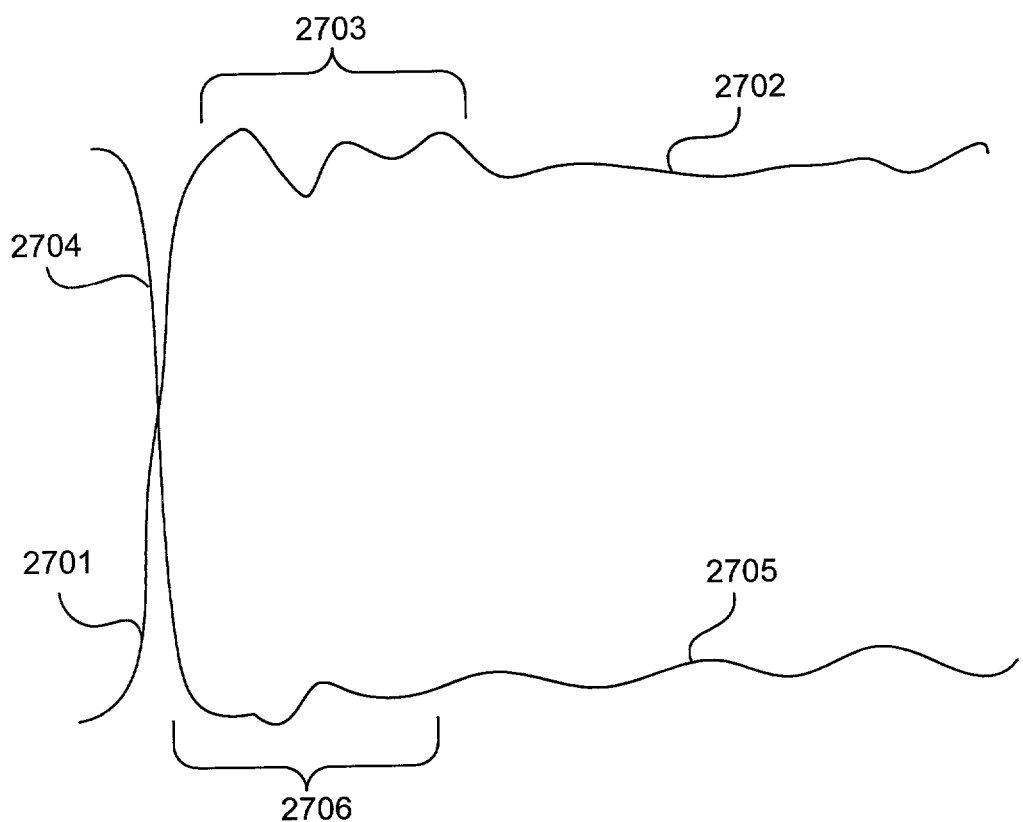
FIG. 27 is a waveform diagram illustrating an example of a persistent display of overlapping samples of a waveform in accordance with an embodiment of the invention.

FIG. 27 is a waveform diagram illustrating an example of a display of samples of a waveform in accordance with an embodiment of the invention. This example may also be applied to determination of a step response. In this diagram, the transmit clock is operated at a higher frequency than the receive clock (in this example, four times the receive clock frequency). In this example, a simplified transmit repeating pattern of 1111 1111 0000 000 is used. As can be seen, reducing the receive clock frequency can be used to allow display of the waveform over multiple symbol times. In this example, rising edge 2701 leads to high level 2702, allowing detailed observation of ringing effect 2703. Also, falling edge 2704 leads to low level 2705, allowing detailed observation of ringing effect 2706. While rising edge 2701 overlaps with falling edge 2704, the greatly expanded detail with which the waveform is displayed due to combinations of a simplified pattern and clocking at a lower frequency avoids the problems of the rising edge 2701 and the falling edge 2704 obscuring one another.

In accordance with an embodiment of the invention, an iterative process may be applied to adjust system parameters so as to minimize the ringing effects 2703 and 2706 illustrated in FIG. 27. By reducing the frequency of the receive circuit clock relative to the transmit circuit clock, multiple symbols may be observed. Ringing patterns 2703 and 2706 may be observed regardless of whether they are one symbol or multiple symbols away from a causative transition. For example, in a transmission line environment, a transition may cause a disturbance, such as the ringing pattern 2703 or 2706, that propagates along a transmission line until it is reflected at some point along the transmission line and is observed at some later time relative to the time at which the causative transition occurred. By properly adjusting the timing relationships affecting the portion of the signal being observed, such disturbances can be observed regardless of their temporal position relative to the causative transition.

Figure 28:
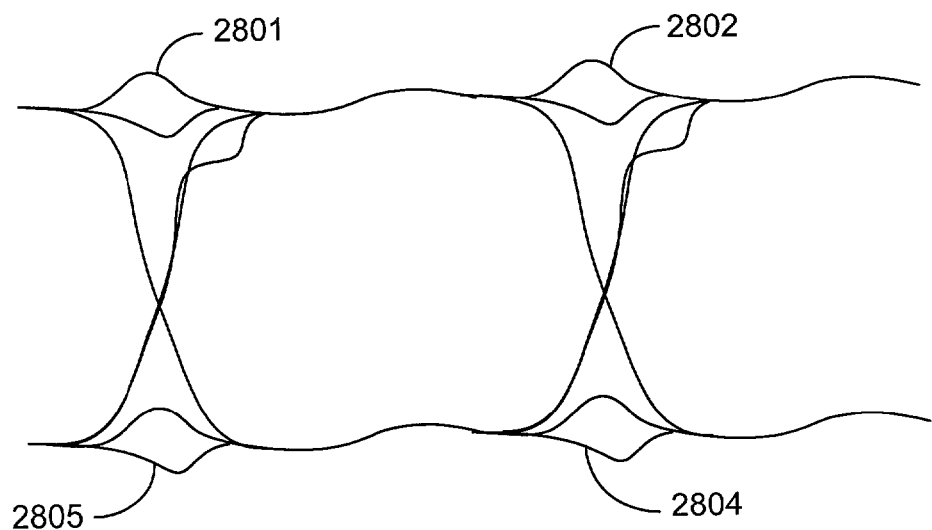
FIG. 28 is a waveform diagram illustrating an example of a persistent display of overlapping samples of a waveform in accordance with an embodiment of the invention.

FIG. 28 is a waveform diagram illustrating an example of a persistent display of overlapping samples of a waveform in accordance with an embodiment of the invention. One embodiment of the invention may be used to provide information similar to that which is traditionally obtainable through the use of an oscilloscope. In the test mode, comparison can be made between a pattern generated in the transmit circuit and a pattern generated in the receive circuit. This testing can be reiterated for different receiver timing and overdrive conditions while the signal representing the pattern is being compared. When the time and overdrive condition of the receiver is varied to the region where the pattern comparisons yield inconsistent results, the failing region corresponds to a metastable region of the receiver. When these metastable regions are plotted, they outline the signal waveform that is being received at the receiver, including the signal uncertainty (jitter) and the receiver timing and overdrive deadband requirement.

Hence, the outline of these metastable regions represent the signal as seen by the receiver with its own receiving characteristics. With this capability of visualizing the signal, various effects on the signal can be checked out. For example, an output current level, crosstalk, attenuation, etc. In case of unwanted signal integrity behaviors, different compensation techniques can be used to reduce or eliminate those behaviors. The term "metastable" as used herein refers to a region wherein the receiver is unable to reliably identify a level of an incoming signal. Thus, for the same level of the incoming signal, the receiver will, on different occasions, identify that level to be different levels. Thus, for repetitions of a given incoming signal, the receiver will not provide a repeatable output within the metastable region. Thus, the metastable region may also be referred to as a region of unrepeatability. Consequently, to identify such a region, the transmit circuit and the receive circuit may be configured to operate using patterns having lengths or periods that bear a multiple and submultiple relationship to each other, and any lack of repeatability of the receiver may be observed. As an example, the length or period of a transmit repeating pattern may be a multiple of the length or period of a receive repeating pattern, and the length or period of the receive repeating pattern may be a submultiple of the length or period of the transmit repeating pattern. As another example, the length or period of a receive repeating pattern may be a multiple of the length or period of a transmit repeating pattern, and the length or period of the transmit repeating pattern may be a submultiple of the length or period of the receive repeating pattern. A transmit clock rate of a transmit repeating pattern and a receive clock rate of a receive repeating pattern may bear a multiple and submultiple relationship to one another. One subset of all possible multiple and submultiple relationships is a one-to-one relationship.

The example of FIG. 28 illustrates samples of waveforms exhibiting the effects of crosstalk induced by other nearby conductors, as can be seen, for example at locations 2801, 2802, 2805, and 2804.

Figure 29:
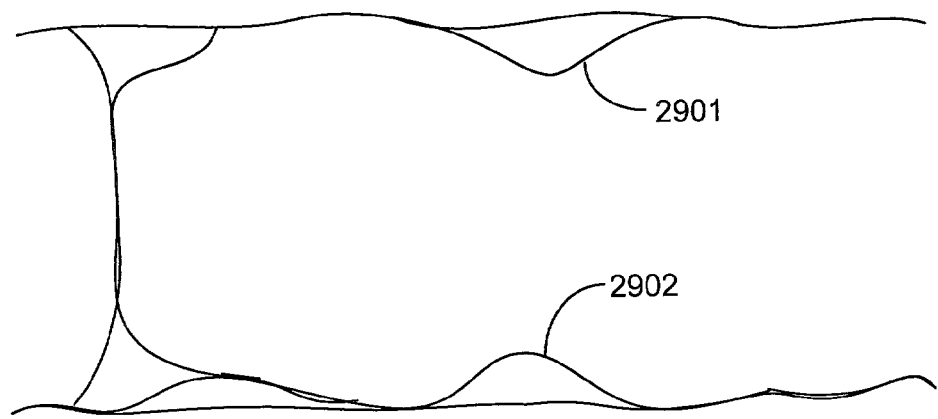
FIG. 29 is a waveform diagram illustrating an example of a persistent display of overlapping samples of a waveform in accordance with an embodiment of the invention.

FIG. 29 is a waveform diagram illustrating an example of a persistent display of overlapping samples of a waveform in accordance with an embodiment of the invention. The example of FIG. 29 shows results obtained using "step response" types of waveforms. Locations 2901 and 2902 illustrate effects of an impedance discontinuity in the medium between the transmit circuit and the receive circuit.

Figure 30:
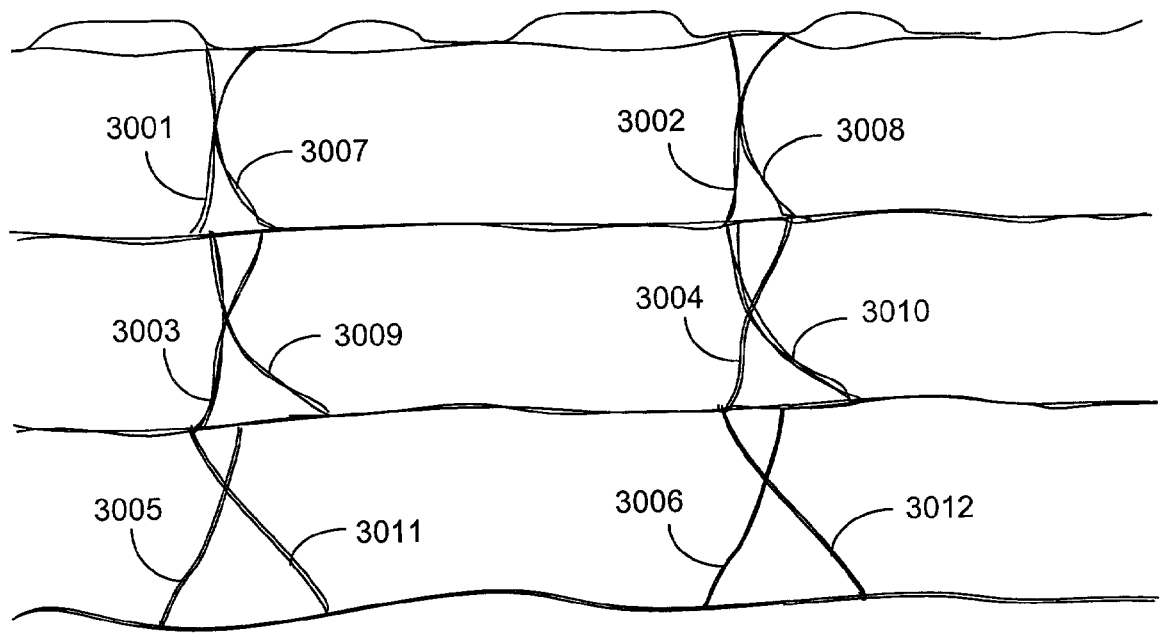
FIG. 30 is a waveform diagram illustrating an example of a persistent display of overlapping samples of a waveform in accordance with an embodiment of the invention.

FIG. 30 is a waveform diagram illustrating an example of a persistent display of overlapping samples of a waveform in accordance with an embodiment of the invention. The example of FIG. 30 illustrated a 4-level pulse amplitude modulation (4-PAM) generated using patterns representing a stair-step-type signal. Differences between the rising edges 3001, 3002, 3003, 3004, 3005, and 3006 and their respective falling edges 3007, 3008, 3009, 3010, 3011, and 3012 are observable.

Thus, in view of FIGS. 25–30, it can be seen that an embodiment of the invention provides a powerful tool for in-situ characterization and optimization of signaling systems. Characteristics that could not be determined using traditional test equipment are readily ascertainable in accordance with an embodiment of the invention.

Figure 31:
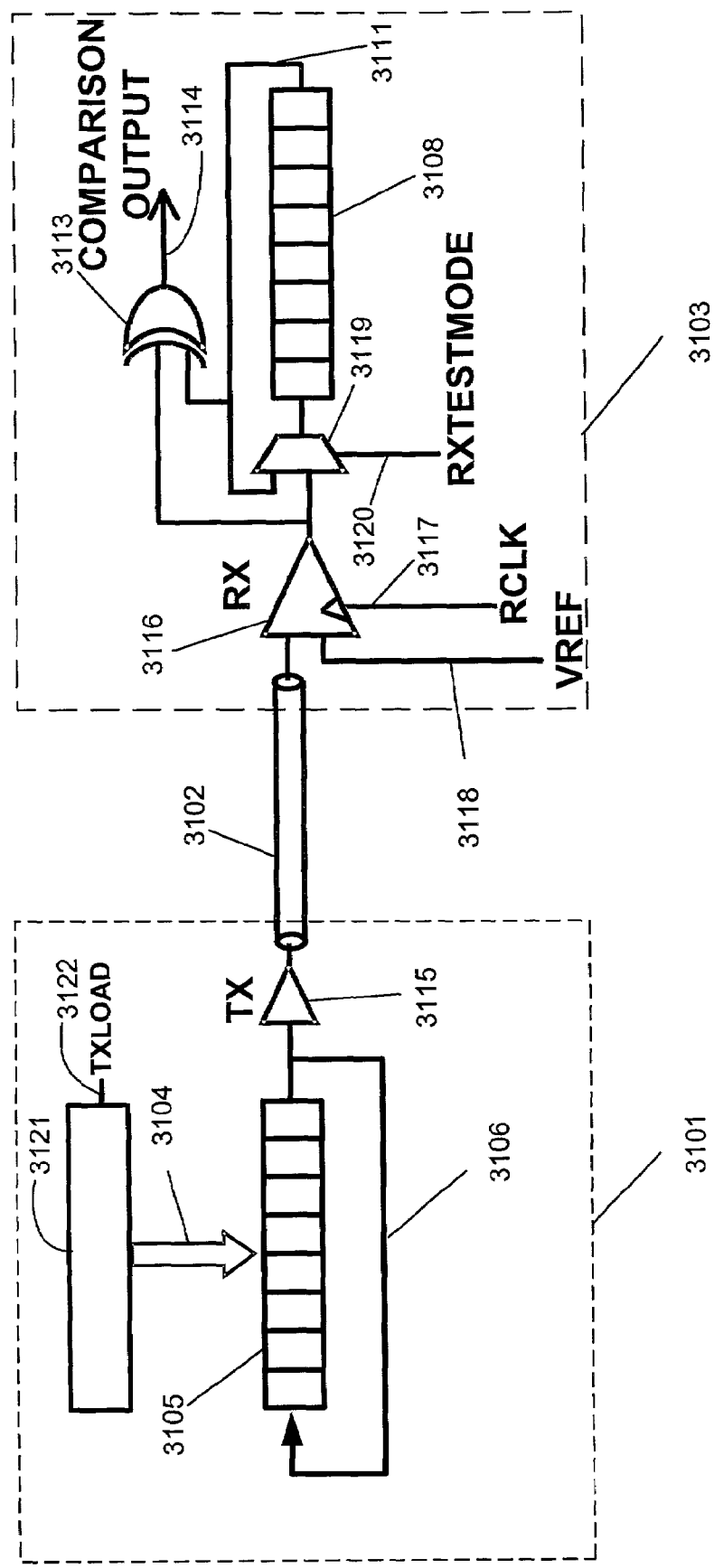
FIG. 31 is a block diagram illustrating a system in accordance with an embodiment of the invention.

FIG. 31 is a block diagram illustrating a system in accordance with an embodiment of the invention. The system comprises transmit circuit 3101, medium 3102, and receive circuit 3103. Transmit circuit 3101 comprises a shift register 3105 having a parallel load input 3104 to load data from register 3121. A transmit circuit load signal coupled to an input of register 3121 at node 3122 is used to control the loading of data. A feedback loop 3106 couples a serial data output of shift register 3105 to a serial data input of shift register 3105. The serial data output of shift register 3105 is also coupled to an input of transmitter 3115. An output of transmitter 3115 is coupled to medium 3102.

Receiver circuit 3103 comprises receiver 3116, multiplexer 3119, shift register 3108, and XOR gate 3113. Medium 3102 is coupled to an input of receiver 3116. A receive circuit timing signal is coupled to an input of receiver 3116 at node 3117. A voltage reference signal is coupled to an input of receiver 3116 at node 3118. An output of receiver 3116 is coupled to an input of multiplexer 3119 and to an input of XOR gate 3113. A fill pipe signal is coupled to a selection input of multiplexer 3119 at node 3120. An output of multiplexer 3119 is coupled to a serial data input of shift register 3108. A serial data output of shift register 3108 is coupled to an input of multiplexer 3119 and to an input of XOR gate 3113 via line 3111. An output of XOR gate 3113 provides an error output at node 3114.

Figure 32:
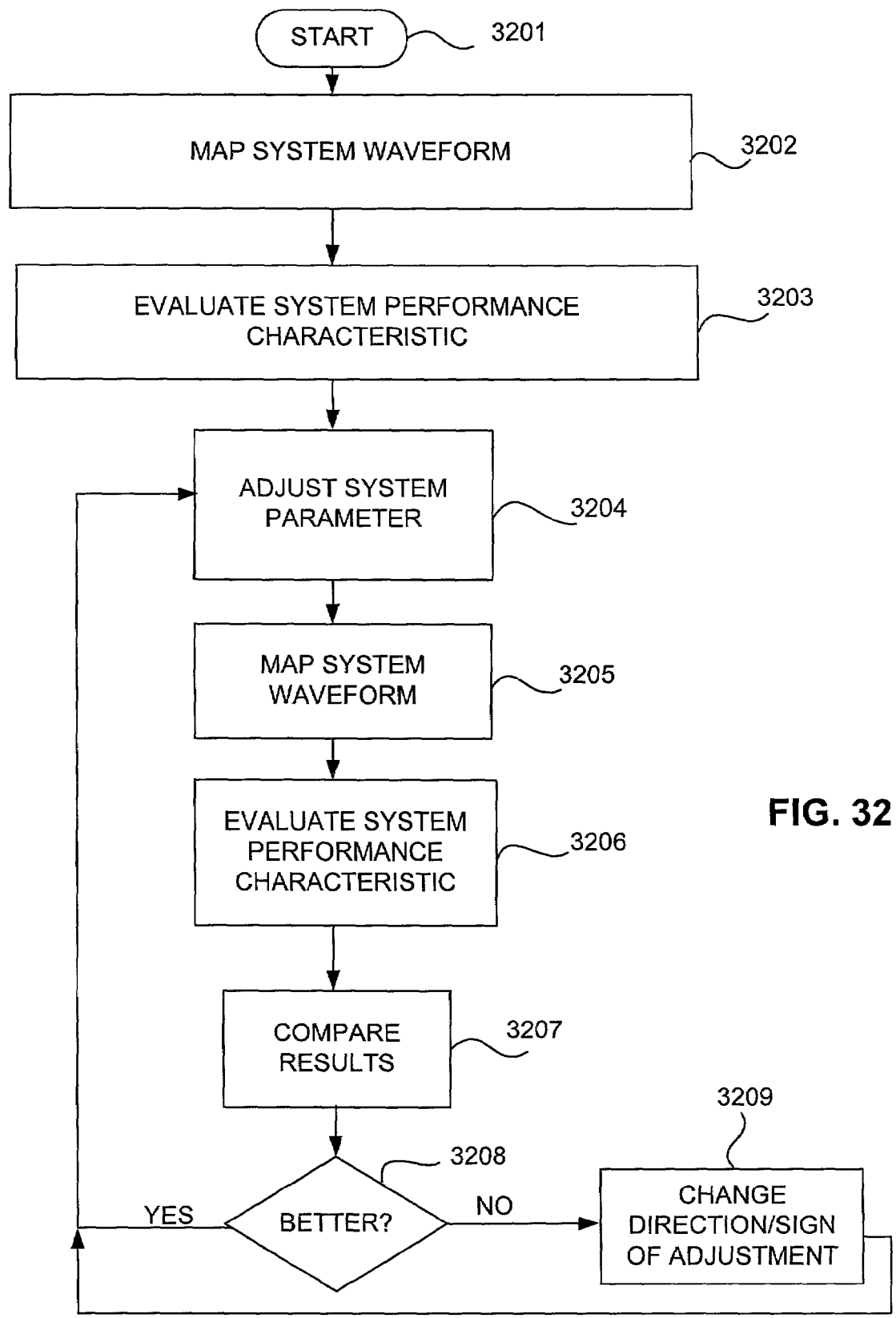
FIG. 32 is a flow diagram illustrating a method in accordance with an embodiment of the invention.

FIG. 32 is a flow diagram illustrating a method in accordance with an embodiment of the invention. The method begins in step 3201 and continues to step 3202. In step 3202, mapping of a system waveform is performed, for example, according to some or all of steps 2402 through 2412 of FIG. 24. From step 3202, the method proceeds to step 3203. In step 3203, a system performance characteristic is evaluated based on information obtained in step 3202. For example, a system performance characteristic, such as a voltage margin, a timing margin, a value of a voltage level, or timing of an edge, may be evaluated. In step 3204, one or more system parameters are adjusted. These system parameters may include, for example, an output current, a crosstalk cancellation coefficient, a self-equalization coefficient, a receive circuit timing signal, and a voltage reference.

From step 3204, the method continues to step 3205. In step 3205, mapping of a system waveform is performed, for example, in a manner as described in relation to step 3202. From step 3205, the method continues to step 3206. In step 3206, a system performance characteristic is evaluated, for example, in a manner as described in relation to step 3203. In step 3207, the results of the evaluation of step 3203 and the evaluation of step 3206 are compared. In step 3208, a determination is made based on the comparison of 3207. If the results of the evaluation of step 3206 are better (e.g., closer to a desired performance level of a system performance characteristic) than the results of the evaluation of step 3203, the method returns to step 3204 for further adjustment of one or more system parameters using the same direction or sign of adjustment. If, however, the results of the evaluation of step 3206 are not better than the results of the evaluation of step 3203, the method continues to step 3209. In step 3209, the direction or sign of the system parameter adjustment to be performed is changed. From step 3209, the method returns to step 3204 for further adjustment of one or more system parameters in accordance with the change of direction or sign provided in step 3209.

Iterations of this method may continue as long as desired, for example, until a desired performance level of a system performance characteristic is obtained. As another example, iterations may continue until an optimal level of a system performance characteristic is reached. Multiple iterations of the method can be performed to allow adjustment of each system performance characteristic to its optimal level. For example, one system performance characteristic can be optimized, then a second system performance characteristic can be optimized, thereby providing sequential optimization of multiple system performance characteristics. Once a desired or optimal performance level of the system is obtained, the process illustrated in FIG. 32 may end.

The method of FIG. 32 may be performed until the system reaches a generally steady state condition. Such steady state conditions may be defined at a plurality of levels. For example, at a broader level, the steady state condition may be more approximate, while, at a narrower level, the steady state condition may be more precise. As an example, a steady state condition may be identified when step 3209 occurs, especially if it occurs several times over a relatively small range of adjustment of the relevant system parameter. Adjustment back and forth within a limited range may be observed as "dithering" and may be used to indicate completion of the method of FIG. 32. If hysteresis occurs during adjustment, such that no specific value for the system parameter is identified for the steady state condition, a value can be interpolated within the range of adjustment observed. For example, a value in the middle of the range may be selected. When the method of FIG. 32 is completed for one system parameter, it may be repeated for a different system parameter. Alternatively, multiple system parameters may be adjusted simultaneously.

Figure 33:
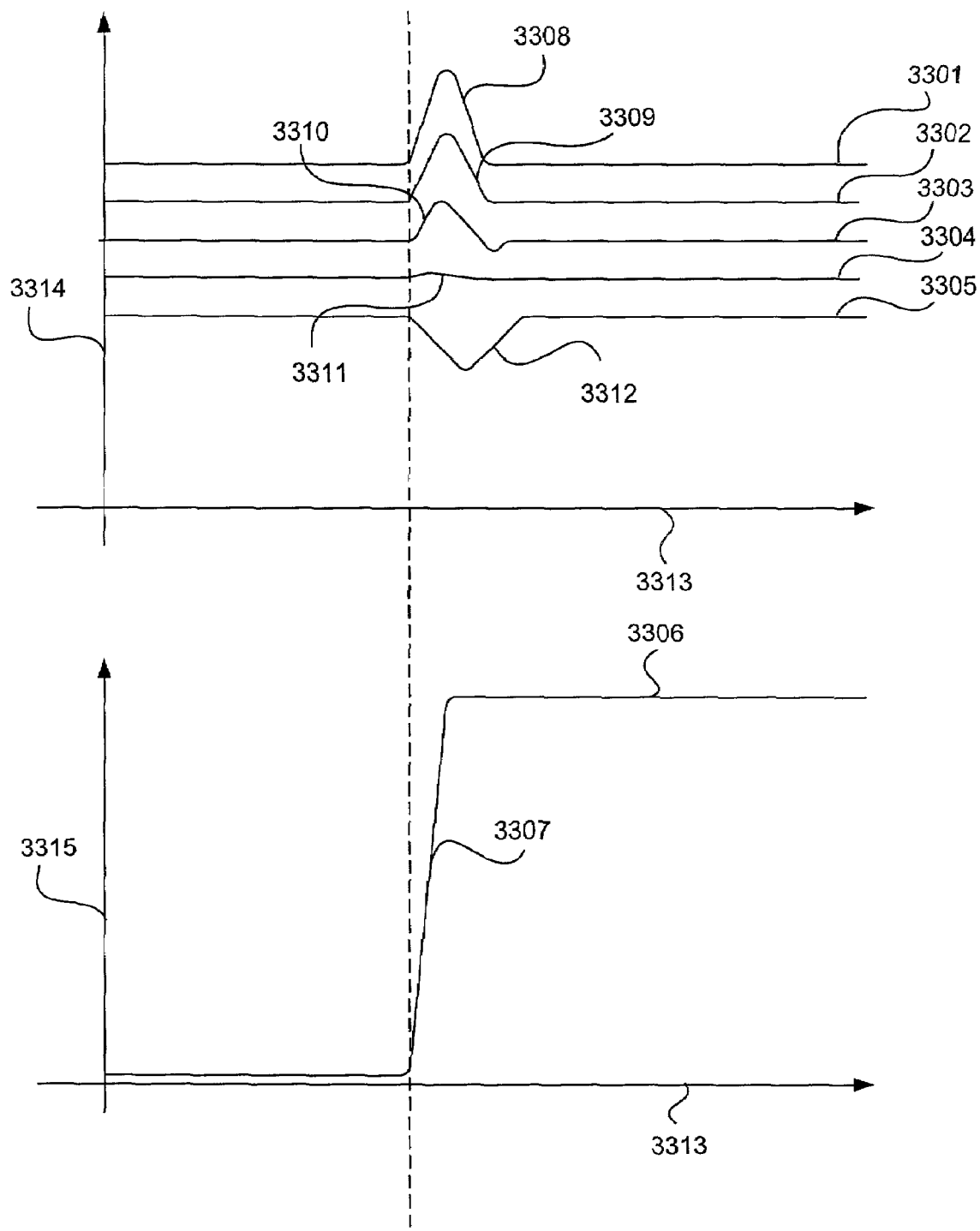
FIG. 33 is a waveform diagram illustrating optimization of crosstalk cancellation resulting from iterative application of the method illustrated in FIG. 32 in accordance with an embodiment of the invention.

FIG. 33 is a waveform diagram illustrating optimization of crosstalk cancellation resulting from iterative application of the method illustrated in FIG. 32 in accordance with an embodiment of the invention. Waveforms 3301, 3302, 3303, 3304, and 3305, representing a non-transitioning portion of a signal subject to iterative application of the method described in relation to FIG. 32, are illustrated in relation to a horizontal axis 3313 and a vertical axis 3314. The horizontal axis 3313 may represent, for example, time, while the vertical axis 3314 may represent, for example, an amplitude, such as a voltage.

Waveform 3306, representing a transitioning portion of an adjacent signal, is illustrated in relation to the horizontal axis 3313 and a vertical axis 3315, which may represent, for example, an amplitude, such as a voltage. Waveforms 3301, 3302, 3303, 3304, and 3305 exhibit disturbances 3308, 3309, 3310, 3311, and 3312, respectively, which result from the influence of the sharply rising edge 3307 of waveform 3306, which causes a crosstalk phenomenon.

With a first set of values of system parameters, the disturbance 3308 occurs when waveform 3301 is influenced by waveform 3306. By adjusting system parameters, the amplitude of the disturbance can be reduced. Thus, with a second set of values of system parameters, the disturbance 3309 of waveform 3302 is of a lesser amplitude than disturbance 3308 of waveform 3301. Yet, the crosstalk phenomenon is still undercompensated. A third set of values of system parameters yields a further reduced amplitude of disturbance 3310 of waveform 3303. A fourth set of values of system parameters results in waveform 3304 being almost immune to the crosstalk phenomenon, exhibiting only disturbance 3311 of very slight amplitude. A fifth set of values of system parameters overcompensates for the influence of waveform 3306, resulting in disturbance 3312 of an opposite polarity affecting waveform 3305.

Therefore, using by detecting undercompensation and overcompensation, the iterative application of the method described in reference to FIG. 32 can be used to find optimal values for system parameters, for example, the system parameters that result in waveform 3304. If desired, additional iterations could be performed using sets of values of system parameters between those of waveforms 3303 and 3305 to more finely adjust the optimal values.

As one skilled in the art can readily appreciate, there are myriad system parameters that can be optimized in accordance with an embodiment of the invention. Some examples of parameters that can be adjusted in this manner include equalization coefficients, crosstalk cancellation coefficients, output drive levels, termination settings, transmit and receive clock offsets, input receiver windows, as well as many others. A termination setting is a parameter that affects a termination impedance of a transmission line. A transmit clock offset is a parameter that affects the temporal position of a clock signal in a transmit circuit or the temporal position of a signal transmitted by a transmit circuit. A receive clock offset is a parameter that affects the temporal position of a clock signal in a receive circuit, the temporal position of a signal used by the receive circuit for receiving a transmitted signal, or the temporal position of a sampling time during which a transmitted signal is sampled by the receive circuit. An input receiver window is a parameter affecting the differentiation of different logic levels in the receive circuit. An output drive level is a parameter affecting the representation of different logic levels at the transmit circuit. A crosstalk cancellation coefficient is a parameter affecting immunity to crosstalk caused by signals on other conductors. An equalization coefficient is a parameter that may be adjusted to effect equalization adjustment.

FIG. 2 is a logic diagram illustrating a prior art transmit circuit. Node 201 is coupled to a serial data input of a shift register comprising flip-flops 215, 217, 219, and 221. A load signal for performing a parallel data load of the shift register is provided to the shift register at node 203. A transmit clock signal is provided to a clock input of the shift register at node 205. Nodes 207, 209, 211, and 213 are coupled to parallel load data inputs of flip-flops 215, 217, 219, and 221, respectively. The serial data output of the shift register at the output of flip-flop 221 is coupled to node 223, which is coupled to an input of multiplexer 226.

Node 202 is coupled to a serial data input of a shift register comprising flip-flops 216, 218, 220, and 222. A load signal for performing a parallel data load of the shift register is provided to the shift register at node 204. A transmit clock signal is provided to a clock input of the shift register at node 206. Nodes 208, 210, 212, and 214 are coupled to parallel load data inputs of flip-flops 216, 218, 220, and 222, respectively. The serial data output of the shift register at the output of flip-flop 222 is coupled to node 224, which is coupled to an input of multiplexer 226.

A transmit clock signal is provided to a input of multiplexer 226 at node 225. The output of multiplexer 226 is coupled to node 230, which is coupled to an input of output driver 227. An output of output driver 227 is coupled to node 228, which is coupled to pad 229.

FIG. 3 is a logic diagram illustrating a prior art receive circuit. Pad 301 is coupled to node 302, which is coupled to an input of even receiver 305 and to an input of odd receiver 306. A receive clock signal is provided to an input of even receiver 305 at node 303 and to an input of odd receiver 306 at node 304. An output of even receiver 305 at node 307 is coupled to an input of a shift register comprising flip-flops 313, 315, 317, and 319. A receive clock is provided to a clock input of the shift register at node 309. An unload signal for providing parallel data outputs from the shift register is applied to the shift register via node 311. Parallel data are provided at parallel data outputs 321, 323, 325, and 327 of flip-flops 313, 315, 317, and 319, respectively.

An output of odd receiver 306 at node 308 is coupled to an input of a shift register comprising flip-flops 314, 316, 318, and 320. A receive clock is provided to a clock input of the shift register at node 310. An unload signal for providing parallel data outputs from the shift register is applied to the shift register via node 312. Parallel data are provided at parallel data outputs 322, 324, 326, and 328 of flip-flops 314, 316, 318, and 320, respectively.

Figure 4:
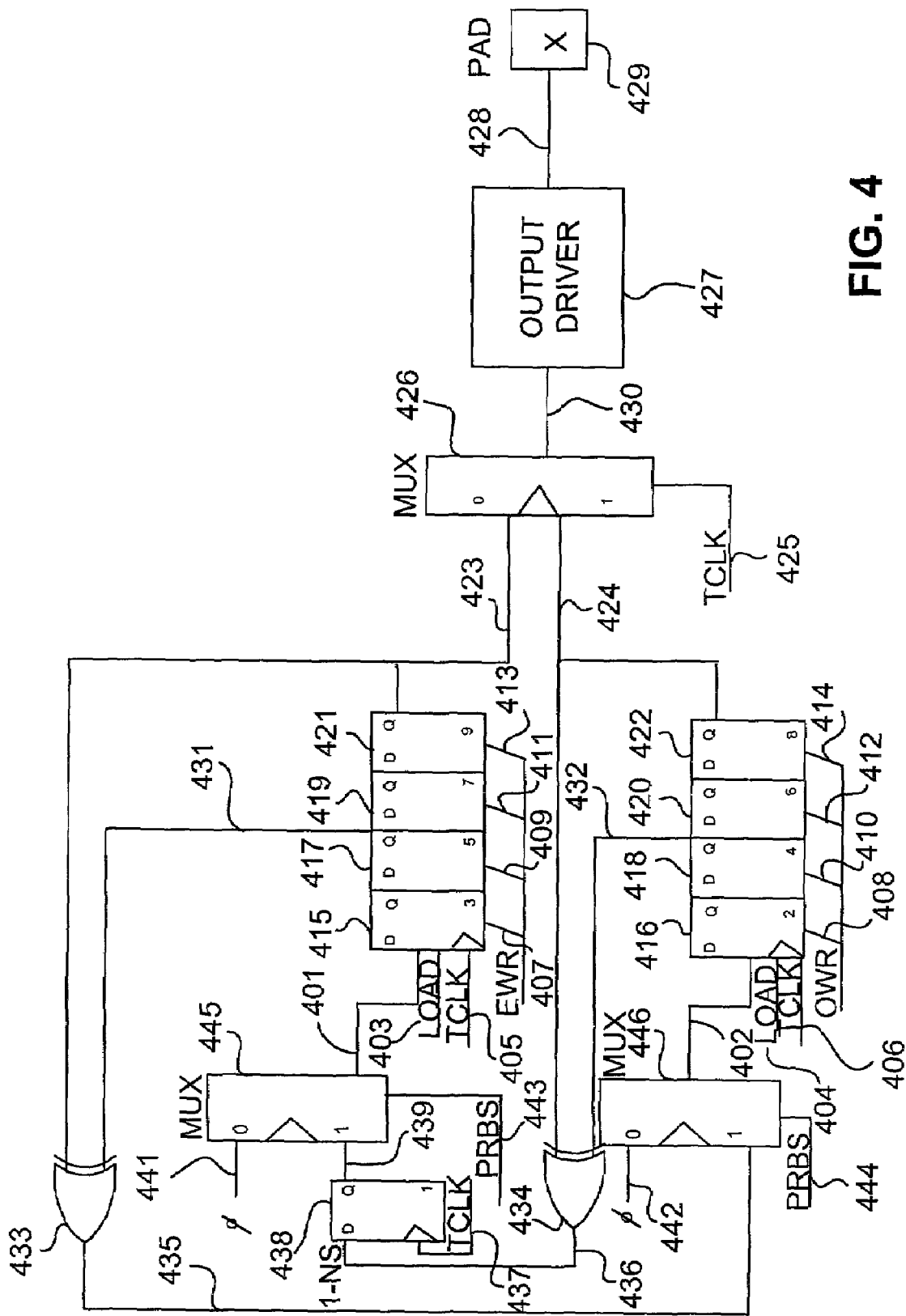
FIG. 4 is a logic diagram illustrating a transmit circuit capable of operating in a pseudo-random bit sequence (PRBS) test mode in accordance with an embodiment of the invention.

FIG. 4 is a logic diagram illustrating a transmit circuit capable of operating in a PRBS test mode in accordance with an embodiment of the invention. Node 401 is coupled to a serial data input of a shift register comprising flip-flops 415, 417, 419, and 421. A load signal for performing a parallel data load of the shift register is provided to the shift register at node 403. A transmit clock signal is provided to a clock input of the shift register at node 405. Nodes 407, 409, 411, and 413 are coupled to parallel load data inputs of flip-flops 415, 417, 419, and 421, respectively.

The serial data output of the shift register at the output of flip-flop 421 is coupled to node 423, which is coupled to an input of multiplexer 426. Node 423 is also coupled to an input of XOR gate 433. A signal at node 431 taken from the data output of flip-flop 417 is coupled to an input of XOR gate 433. The output of XOR gate 433 is coupled to an input of multiplexer 446 via node 435. A fixed logic zero signal is coupled to an input of multiplexer 446 at node 442. A PRBS test signal is coupled to a selection input of multiplexer 446 via node 444. The output of multiplexer 446 is coupled to node 402.

Node 402 is coupled to a serial data input of a shift register comprising flip-flops 416, 418, 420, and 422. A load signal for performing a parallel data load of the shift register is provided to the shift register at node 404. A transmit clock signal is provided to a clock input of the shift register at node 406. Nodes 408, 410, 412, and 414 are coupled to parallel load data inputs of shift registers 416, 418, 420, and 422, respectively.

Node 424 is taken from a serial data output of the shift register at the output of flip-flop 422 and is coupled to an input of multiplexer 426 and to an input of XOR gate 434. A signal at node 432 taken from the data output of flip-flip 418 is coupled to an input of XOR gate 434. The output of XOR gate 434 appears at node 436, which is coupled to an input of flip-flop 438.

A transmit clock signal is provided to a clock input of flip-flop 438 via node 437. An output of flip-flop 438 is coupled to an input of multiplexer 445 via node 439. A fixed logic zero input is coupled to an input of multiplexer 445 at node 441. A PRBS test signal is coupled to a selection input of multiplexer 445 via node 443. An output of multiplexer 445 is coupled to node 401.

A transmit clock signal is provided to multiplexer 426 via node 425. The output of multiplexer of 426 is coupled via node 430 to an input of output driver 427. Output driver 427 provides an output at node 428, which is coupled to pad 429.

Figure 5:
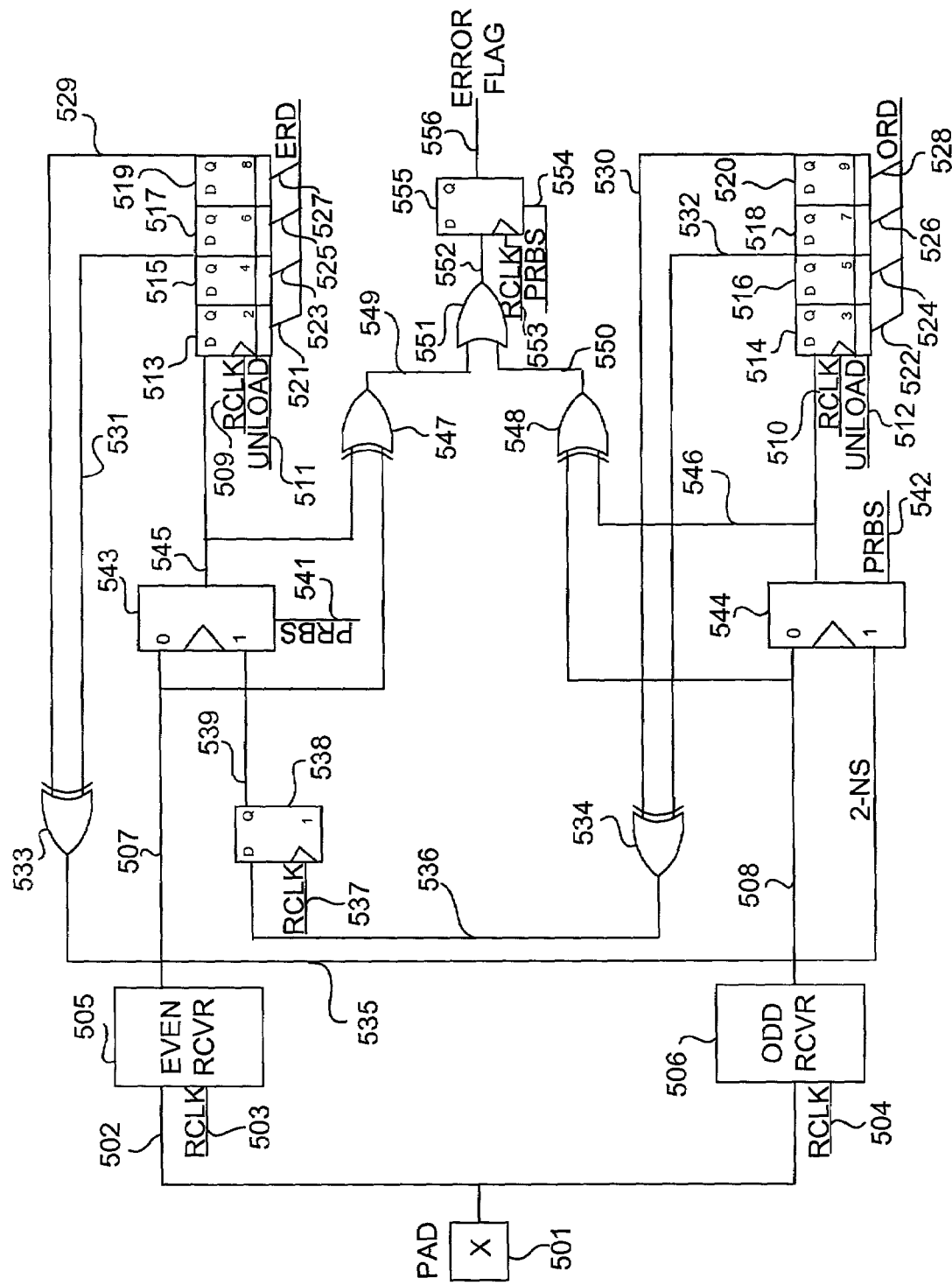
FIG. 5 is a logic diagram illustrating a receive circuit capable of operating in a PRBS test mode in accordance with an embodiment of the invention.

FIG. 5 is a logic diagram illustrating a receive circuit capable of operating in a PRBS test mode in accordance with an embodiment of the invention. Pad 501 is coupled to node 502, which is coupled to even receiver 505 and odd receiver 506. A receive clock signal is provided to even receiver 505 at node 503 and to odd receiver 506 at node 504.

An output of even receiver 505 is coupled to an input of multiplexer 543 and to an input of XOR gate 547 via node 507. The output of multiplexer 543 is coupled to an input of XOR gate 547 and to a serial data input of a shift register comprising flip-flops 513, 515, 517, and 519 via node 545. An output of XOR gate 547 is coupled to an input of OR gate 551 at node 549.

A receive clock signal is provided to a clock input of the shift register via node 509. An unload signal for providing parallel data outputs from the shift register is applied to the shift register via node 511. Parallel data are provided at parallel data outputs 521, 523, 525, and 527 of flip-flops 513, 515, 517, and 519, respectively.

An output of flip-flop 519 is coupled to an input of XOR gate 533 via node 529. An output of flip-flop 515 is coupled to an input of XOR gate 533 via node 531. An output of XOR gate 533 is coupled to an input of multiplexer 544 via node 535. A PRBS test signal is applied to a selection input 542 of multiplexer 544.

An output of odd receiver 506 is coupled to an input of multiplexer 544 and to an input of XOR gate 548 via node 508. The output of multiplexer 544 is coupled to an input of XOR gate 548 and to the serial data input of a shift register comprising flip-flops 514, 516, 518, and 520 via node 546. An output of XOR gate 548 is coupled to an input of OR gate 551 at node 550.

A receive clock signal is provided to a clock input of the shift register via node 510. An unload signal for providing parallel data outputs from the shift register is applied to the shift register via node 512. Parallel data are provided at parallel data outputs 522, 524, 526, and 528 of flip-flops 514, 516, 518, and 520, respectively.

An output of flip-flop 520 is coupled to an input of XOR gate 534 via node 530. An output of flip-flop 516 is coupled to an input of XOR gate 534 via node 532. An output of XOR gate 534 is coupled to an input of flip-flop 538 via node 536. A receive clock signal is applied to a clock input 537 of flip-flop 538. An output of flip-flop 538 is coupled to an input of multiplexer 543 via node 539. A PRBS test signal is applied to a selection input 541 of multiplexer 543.

An output of OR gate 551 at node 552 is coupled to an input of flip-flop 555. A receive clock signal is provided to a clock input of flip-flop 555 at node 553. A PRBS test signal is applied to an input of flip-flop 555 at node 554. An error flag output of flip-flop 555 is provided at node 556.

Figure 6:
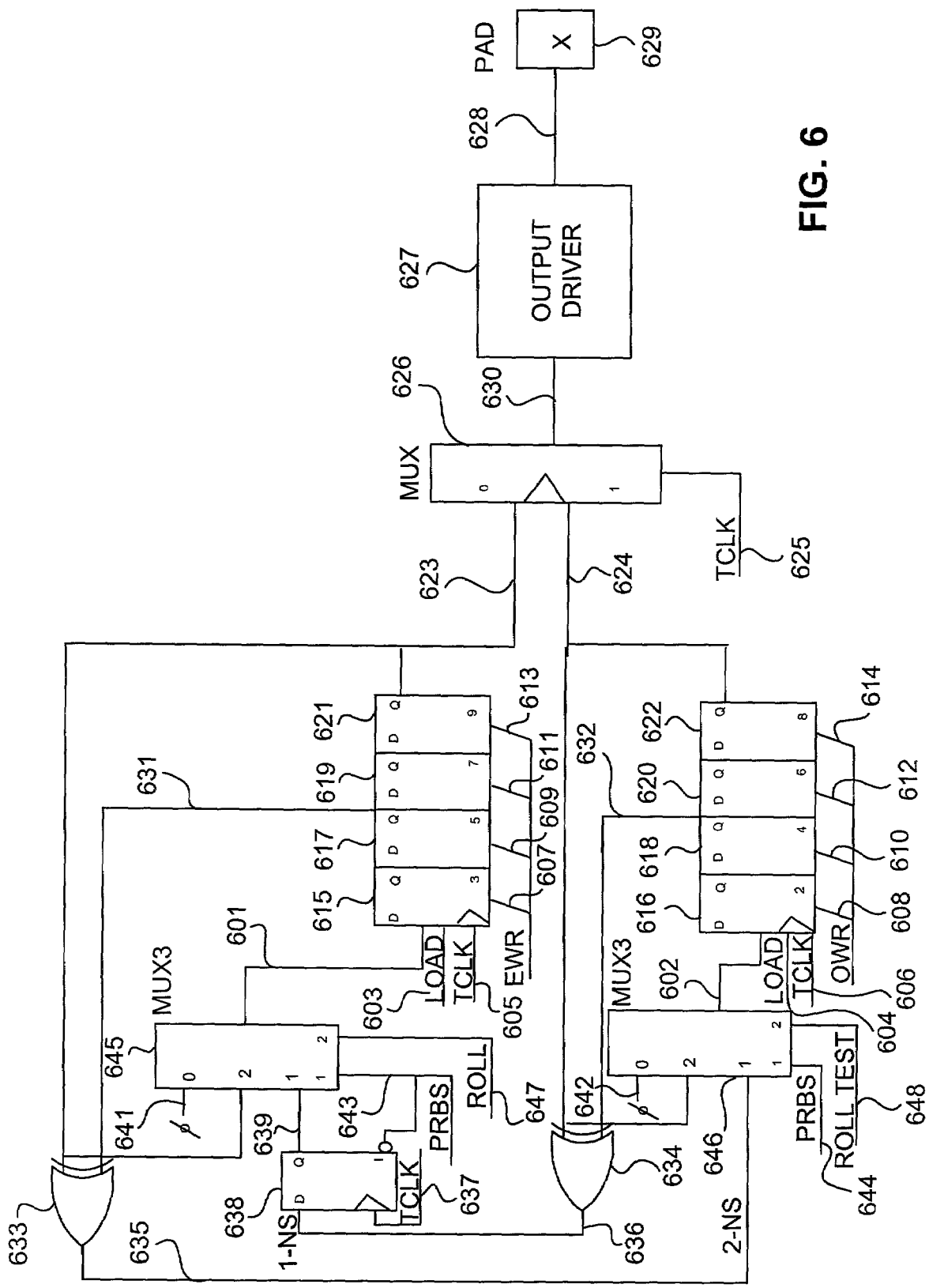
FIG. 6 is a logic diagram illustrating a transmit circuit capable of operating in a PRBS test mode and a roll test mode in accordance with an embodiment of the invention.

FIG. 6 is a logic diagram illustrating a transmit circuit capable of operating in a PRBS test mode and a roll test mode in accordance with an embodiment of the invention. Node 601 is coupled to a serial data input of a shift register comprising flip-flops 615, 617, 619, and 621. A load signal for performing a parallel data load of the shift register is provided to the shift register at node 603. A transmit clock signal is provided to a clock input of the shift register at node 605. Nodes 607, 609, 611, and 613 are coupled to parallel load data inputs of flip-flops 615, 617, 619, and 621, respectively.

The serial data output of the shift register at the output of flip-flop 621 is coupled to node 623, which is coupled to an input of multiplexer 626. Node 623 is also coupled to an input of XOR gate 633 and to an input of multiplexer 645. A signal at node 631 taken from the data output of flip-flop 617 is coupled to an input of XOR gate 633. The output of XOR gate 633 is coupled to an input of multiplexer 646 via node 635. A fixed logic zero signal is coupled to an input of multiplexer 646 at node 642. A PRBS test signal is coupled to a selection input of multiplexer 646 via node 644. A roll test signal is coupled to an input of multiplexer 646 via node 648. The output of multiplexer 646 is coupled to node 602.

Node 602 is coupled to a serial data input of a shift register comprising flip-flops 616, 618, 620, and 622. A load signal for performing a parallel data load of the shift register is provided to the shift register at node 604. A transmit clock signal is provided to a clock input of the shift register at node 606. Nodes 608, 610, 612, and 614 are coupled to parallel load data inputs of shift registers 616, 618, 620, and 622, respectively.

Node 624 is taken from a serial data output of the shift register at the output of flip-flop 622 and is coupled to an input of multiplexer 626, an input of XOR gate 634, and an input of multiplexer 646. A signal at node 632 taken from the data output of flip-flip 618 is coupled to an input of XOR gate 634. The output of XOR gate 634 appears at node 636, which is coupled to an input of flip-flop 638.

A transmit clock signal is provided to a clock input of flip-flop 638 via node 637. An output of flip-flop 638 is coupled to an input of multiplexer 645 via node 639. A fixed logic zero input is coupled to an input of multiplexer 645 at node 641. A PRBS test signal is coupled to a selection input of multiplexer 645 via node 643. A roll test signal is coupled to a selection input of multiplexer 645 via node 647. An output of multiplexer 645 is coupled to node 601.

A transmit clock signal is provided to multiplexer 626 via node 625. The output of multiplexer of 626 is coupled via node 630 to an input of output driver 627. Output driver 627 provides an output at node 628, which is coupled to pad 629.

Figure 7:
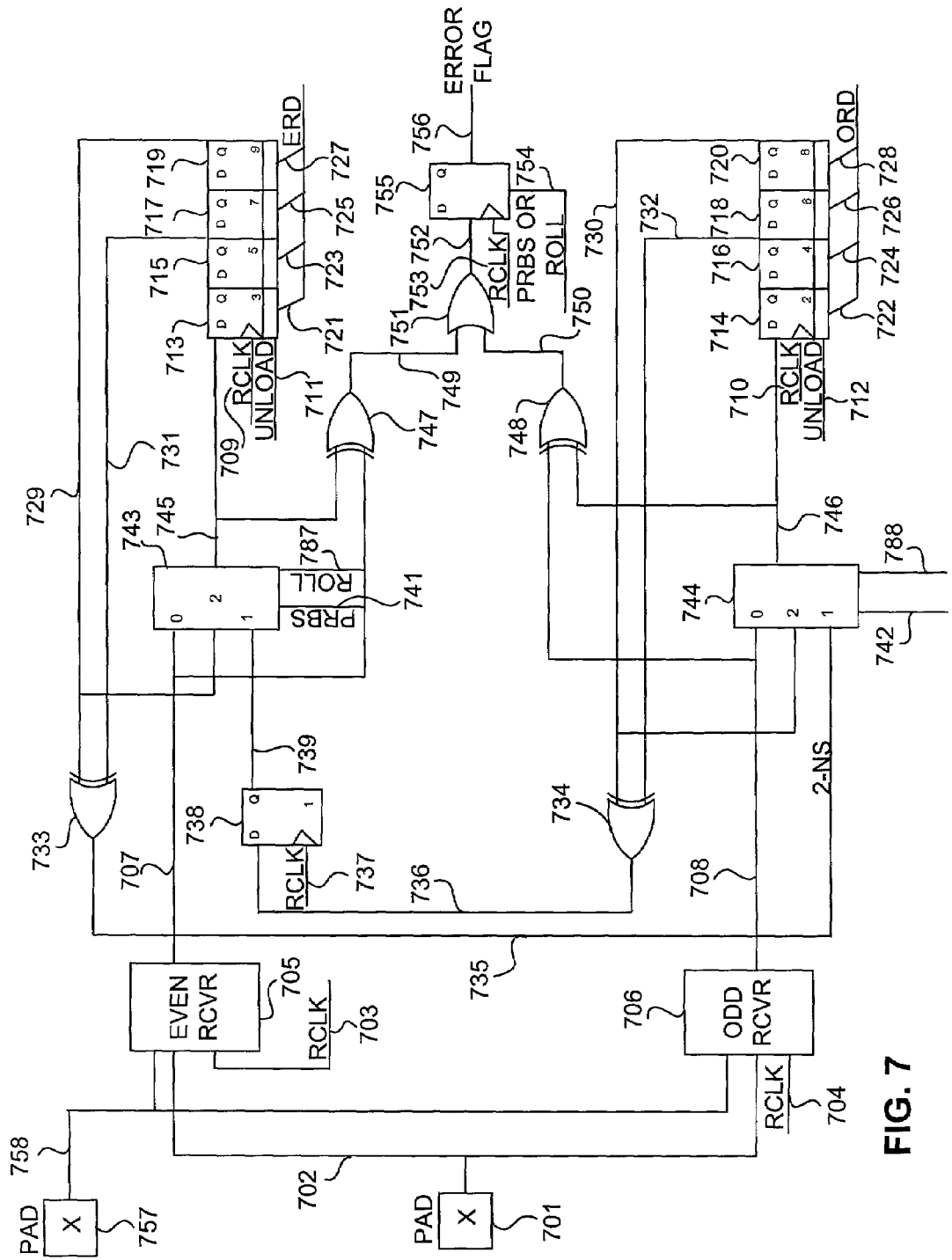
FIG. 7 is a logic diagram illustrating a receive circuit capable of operating in a PRBS test mode and a roll test mode in accordance with an embodiment of the invention.

FIG. 7 is a logic diagram illustrating a receive circuit capable of operating in a PRBS test mode and a roll test mode in accordance with an embodiment of the invention. Pad 701 is coupled to node 702, which is coupled to even receiver 705 and odd receiver 706. A receive clock signal is provided to even receiver 705 at node 703 and to odd receiver 706 at node 704.

An output of even receiver 705 is coupled to an input of multiplexer 743 and to an input of XOR gate 747 via node 707. The output of multiplexer 743 is coupled to an input of XOR gate 747 and to a serial data input of a shift register comprising flip-flops 713, 715, 717, and 719 via node 745. An output of XOR gate 747 is coupled to an input of OR gate 751 at node 749.

A receive clock signal is provided to a clock input of the shift register via node 709. An unload signal for providing parallel data outputs from the shift register is applied to the shift register via node 711. Parallel data are provided at parallel data outputs 721, 723, 725, and 727 of flip-flops 713, 715, 717, and 719, respectively.

An output of flip-flop 719 is coupled to an input of XOR gate 733 and to an input of multiplexer 743 via node 729. An output of flip-flop 715 is coupled to an input of XOR gate 733 via node 731. An output of XOR gate 733 is coupled to an input of multiplexer 744 via node 735. A PRBS test signal is applied to a selection input 742 of multiplexer 744. A roll test signal is applied to a selection input 788 of multiplexer 744.

An output of odd receiver 706 is coupled to an input of multiplexer 744 and to an input of XOR gate 748 via node 708. The output of multiplexer 744 is coupled to an input of XOR gate 748 and to the serial data input of a shift register comprising flip-flops 714, 716, 718, and 720 via node 746. An output of XOR gate 748 is coupled to an input of OR gate 751 at node 750.

A receive clock signal is provided to a clock input of the shift register via node 710. An unload signal for providing parallel data outputs from the shift register is applied to the shift register via node 712. Parallel data are provided at parallel data outputs 722, 724, 726, and 728 of flip-flops 714, 716, 718, and 720, respectively.

An output of flip-flop 720 is coupled to an input of XOR gate 734 and to an input of multiplexer 744 via node 730. An output of flip-flop 716 is coupled to an input of XOR gate 734 via node 732. An output of XOR gate 734 is coupled to an input of flip-flop 738 via node 736. A receive clock signal is applied to a clock input 737 of flip-flop 738. An output of flip-flop 738 is coupled to an input of multiplexer 743 via node 739. A PRBS test signal is applied to a selection input 741 of multiplexer 743. A roll test signal is applied to a selection input 787 of multiplexer 743.

An output of OR gate 751 at node 752 is coupled to an input of flip-flop 755. A receive clock signal is provided to a clock input of flip-flop 755 at node 753. A PRBS test or roll test signal is applied to an input of flip-flop 755 at node 754. An error flag output of flip-flop 755 is provided at node 756.

Figure 8:
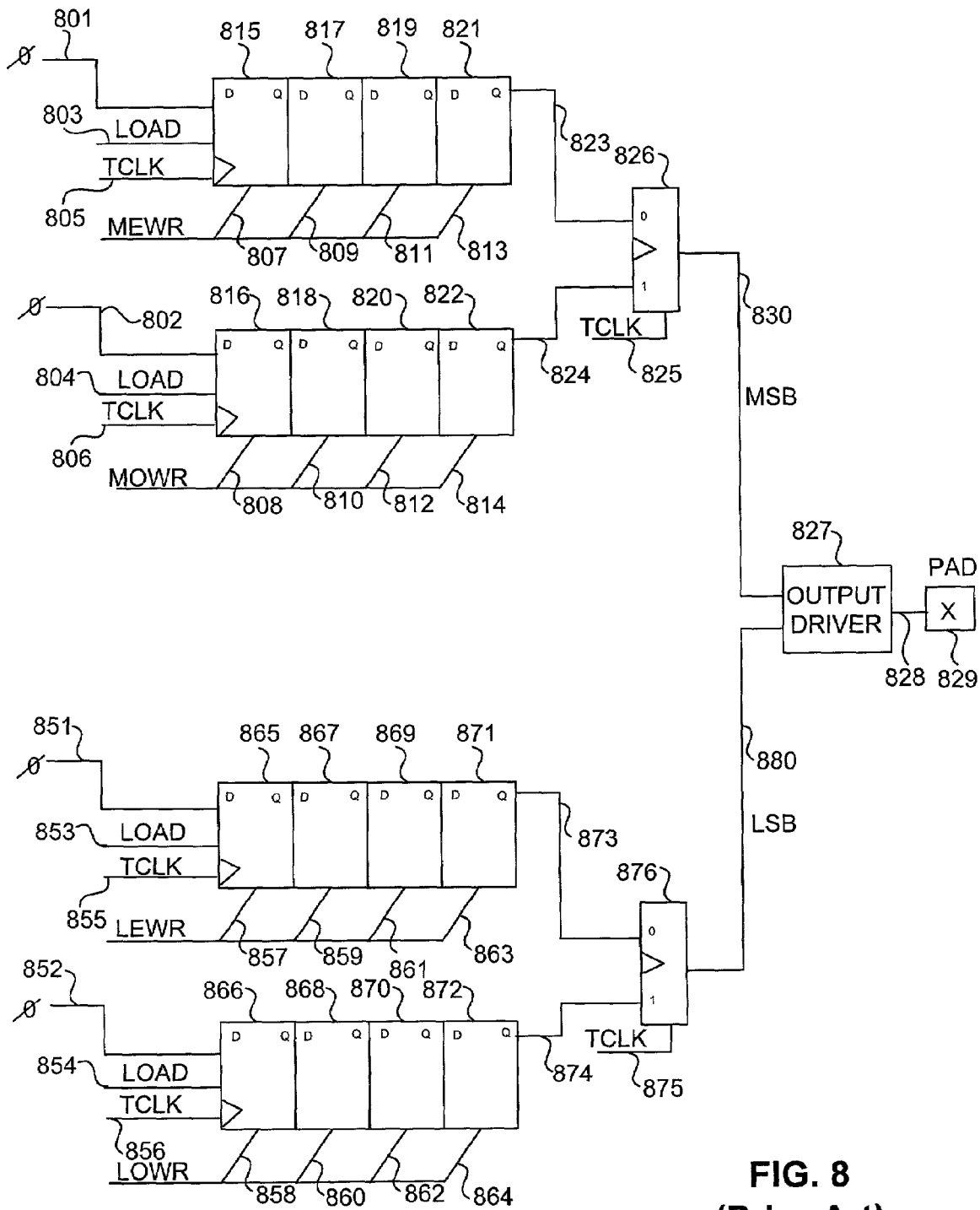
FIG. 8 is a logic diagram illustrating a prior art quad signaling level transmit circuit.

FIG. 8 is a logic diagram illustrating a prior art quad signaling level transmit circuit. A fixed logic zero signal is coupled at node 801 to an input of a shift register comprising flip-flops 815, 817, 819, and 821. A load signal for performing a parallel data load of the shift register is provided to the shift register at node 803. A transmit clock signal is provided to a clock input of the shift register at node 805. Nodes 807, 809, 811, and 813 are coupled to parallel load data inputs of flip-flops 815, 817, 819, and 821, respectively. A serial data output of the shift register at the output of flip-flop 821 is coupled to an input of multiplexer 826 at node 823.

A fixed logic zero signal is coupled at node 802 to an input of a shift register comprising flip-flops 816, 818, 820, and 822. A load signal for performing a parallel data load of the shift register is provided to the shift register at node 804. A transmit clock signal is provided to a clock input of the shift register at node 806. Nodes 808, 810, 812, and 814 are coupled to parallel load data inputs of flip-flops 816, 818, 820, and 822, respectively. A serial data output of the shift register at the output of flip-flop 822 is coupled to an input of multiplexer 826 at node 824.

A fixed logic zero signal is coupled at node 851 to an input of a shift register comprising flip-flops 865, 867, 869, and 871. A load signal for performing a parallel data load of the shift register is provided to the shift register at node 853. A transmit clock signal is provided to a clock input of the shift register at node 855. Nodes 857, 859, 861, and 863 are coupled to parallel load data inputs of flip-flops 865, 867, 869, and 871, respectively. A serial data output of the shift register at the output of flip-flop 871 is coupled to an input of multiplexer 876 at node 873.

A fixed logic zero signal is coupled at node 852 to an input of a shift register comprising flip-flops 866, 868, 870, and 872. A load signal for performing a parallel data load of the shift register is provided to the shift register at node 854. A transmit clock signal is provided to a clock input of the shift register at node 856. Nodes 858, 860, 862, and 864 are coupled to parallel load data inputs of flip-flops 866, 868, 870, and 872, respectively. A serial data output of the shift register at the output of flip-flop 872 is coupled to an input of multiplexer 876 at node 874.

A transmit clock signal is provided to multiplexer 826 via node 825. The output of multiplexer of 826 is coupled via node 830 to an input of output driver 827. A transmit clock signal is coupled to an input of multiplexer of 876 via node 875. The output of multiplexer 876 is coupled to output driver 827 via node 880. Output driver 827 provides an output at node 828, which is coupled to pad 829.

Figure 9:
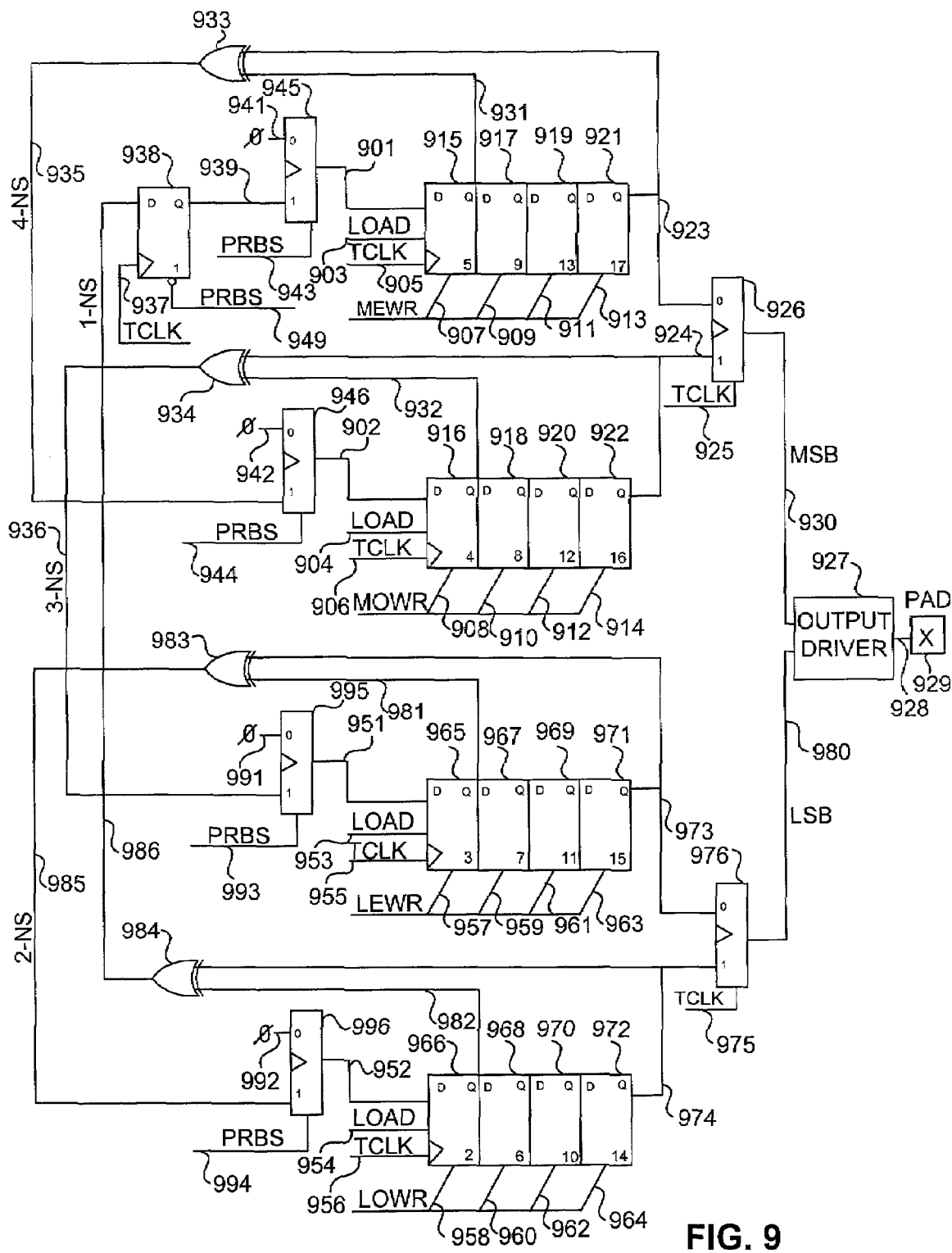
FIG. 9 is a logic diagram illustrating a quad signaling level transmit circuit capable of operating in a PRBS test mode in accordance with an embodiment of the invention.

FIG. 9 is a logic diagram illustrating a quad signaling level transmit circuit capable of operating in a PRBS test mode in accordance with an embodiment of the invention. Node 901 is coupled to a serial data input of a shift register comprising flip-flops 915, 917, 919, and 921. A load signal for performing a parallel data load of the shift register is provided to the shift register at node 903. A transmit clock signal is coupled to a clock input of the shift register at node 905. Nodes 907, 909, 911, and 913 are coupled to parallel load data inputs of flip-flops 915, 917, 919, and 921, respectively.

The serial data output of the shift register at the output of flip-flop 921 is coupled to node 923, which is coupled to an input of multiplexer 926. Node 923 is also coupled to an input of XOR gate 933. A signal at node 931 taken from the data output of flip-flop 915 is coupled to an input of XOR gate 933. The output of XOR gate 933 is coupled to an input of multiplexer 946 via node 935. A fixed logic zero signal is coupled to an input of multiplexer 946 at node 942. A PRBS test signal is coupled to a selection input of multiplexer 946 via node 944. The output of multiplexer 946 is coupled to node 902.

Node 902 is coupled to a serial data input of a shift register comprising flip-flops 916, 918, 920, and 922. A load signal for performing a parallel data load of the shift register is provided to the shift register at node 904. A transmit clock signal is provided to a clock input of the shift register at node 906. Nodes 908, 910, 912, and 914 are coupled to parallel load data inputs of shift registers 916, 918, 920, and 922, respectively.

Node 924 is taken from a serial data output of the shift register at the output of flip-flop 922 and is coupled to an input of multiplexer 926 and to an input of XOR gate 934. A signal at node 932 taken from the data output of flip-flip 916 is coupled to an input of XOR gate 934. The output of XOR gate 934 appears at node 936, which is coupled to an input of multiplexer 995. A fixed logic zero signal is coupled to an input of multiplexer 995 via node 991. A PRBS test signal is coupled to a selection input of multiplexer 995 via node 993. An output of multiplexer 995 is coupled to node 951.

Node 951 is coupled to a serial data input of a shift register comprising flip-flops 965, 967, 969, and 971. A load signal for performing a parallel data load of the shift register is provided to the shift register at node 953. A transmit clock signal is provided to a clock input of the shift register at node 955. Nodes 957, 959, 961, and 963 are coupled to parallel load data inputs of flip-flops 965, 967, 969, and 971, respectively.

Node 973 is taken from the serial data output of the shift register at the output of flip-flop 971 and is coupled to an input of multiplexer 976 and to an input of XOR gate 983. Node 981 provides a signal taken from the data output of flip-flop of 965 and provides it to an input of XOR gate 983. The output of XOR gate 983 appears at node 985 and is coupled to an input of multiplexer of 996. A fixed logic zero signal is coupled to an input of multiplexer 996 via input 992. A PRBS test signal is coupled to a selection input of multiplexer 996 via node 994. The output of multiplexer 996 is coupled to node 952.

Node 952 is coupled to a serial data input of a shift register comprising flip-flops 966, 968, 970, and 972. A load signal for performing a parallel data load of the shift register is provided to the shift register at node 954. A transmit clock signal is provided to a clock input of the shift register at node 956. Nodes 958, 960, 962, and 964 are coupled to parallel load data inputs of flip-flops 966, 968, 970, and 972, respectively.

Node 974 provides a signal taken from the serial data output of the shift register at the output of flip-flop 972 to an input of multiplexer 976 and to an input of XOR gate 984. Node 982 is taken from a data output of flip-flop 966 and coupled to an input of XOR gate 984. XOR gate 984 provides an output at node 986, which is coupled to an input of flip-flop 938.

A transmit clock signal is provided to a clock input of flip-flop 938 via node 937. A PRBS test input signal is provided to an inverted input of flip-flop 938 via node 949.

An output of flip-flop 938 is coupled to an input of multiplexer 945 via node 939. A fixed logic zero input is coupled to an input of multiplexer 945 at node 941. A PRBS test signal is coupled to a selection input of multiplexer 945 via node 943. An output of multiplexer 945 is coupled to node 901.

A transmit clock signal is provided to multiplexer 926 via node 925. The output of multiplexer of 926 is coupled via node 930 to an input of output driver 927. A transmit clock signal is coupled to an input of multiplexer of 976 via node 975. The output of multiplexer 976 is coupled to output driver 927 via node 980. Output driver 927 provides an output at node 928, which is coupled to pad 929.

Figure 10:
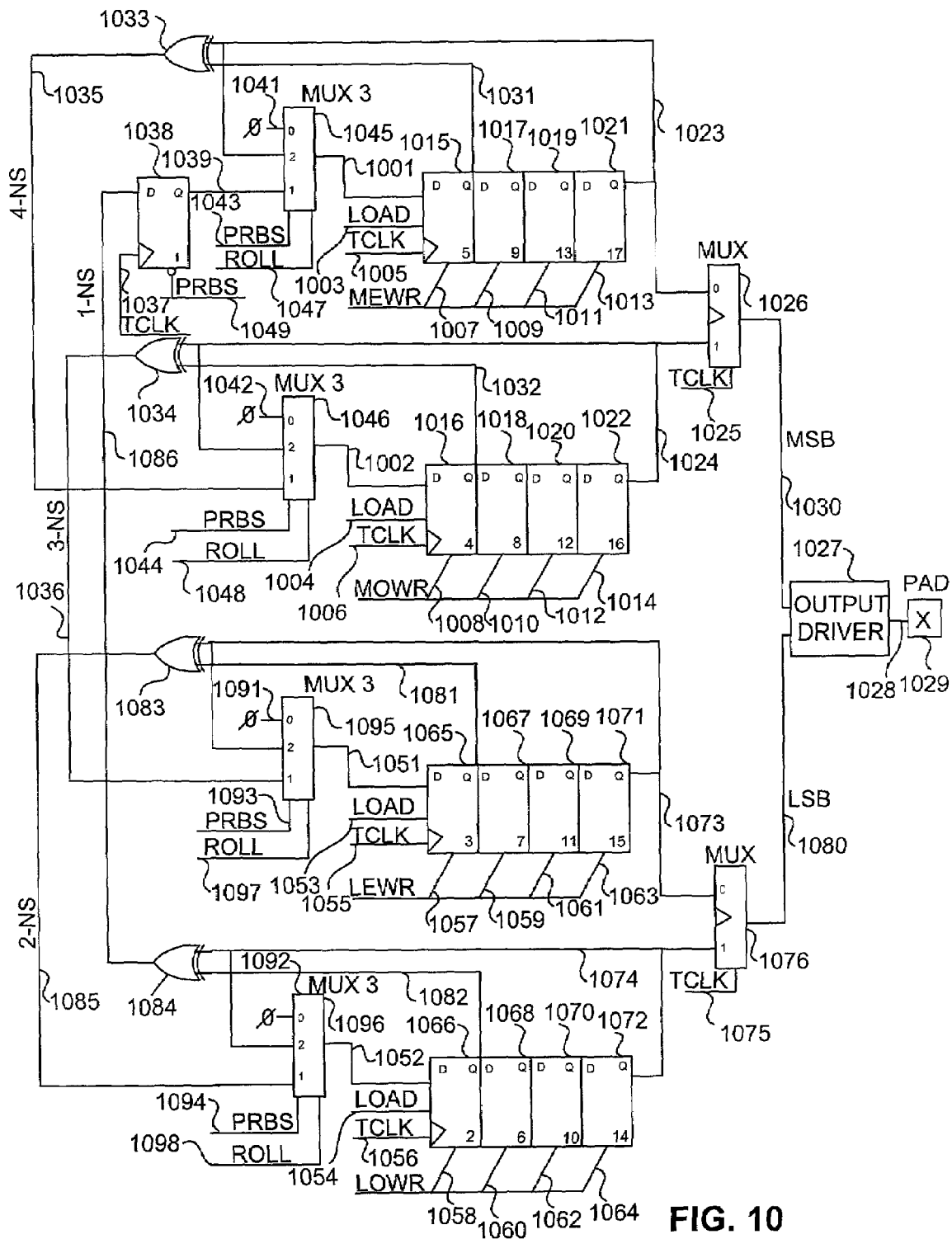
FIG. 10 is a logic diagram illustrating a quad signaling level transmit circuit capable of operating in a PRBS mode and a roll test mode in accordance with an embodiment of the present invention.

FIG. 10 is a logic diagram illustrating a quad signaling level transmit circuit capable of operating in a PRBS mode and a roll test mode in accordance with an embodiment of the present invention. Node 1001 is coupled to a serial data input of a shift register comprising flip-flops 1015, 1017, 1019, and 1021. A load signal for performing a parallel data load of the shift register is provided to the shift register at node 1003. A transmit clock signal is provided to a clock input of the shift register at node 1005. Nodes 1007, 1009, 1011, and 1013 are coupled to parallel load data inputs of flip-flops 1015, 1017, 1019, and 1021, respectively.

The serial data output of the shift register at the output of flip-flop 1021 is coupled to node 1023, which is coupled to an input of multiplexer 1026. Node 1023 is also coupled to an input of XOR gate 1033 and to an input of multiplexer 1045. A signal at node 1031 taken from the data output of flip-flop 1015 is coupled to an input of XOR gate 1033. The output of XOR gate 1033 is coupled to an input of multiplexer 1046 via node 1035. A fixed logic zero signal is coupled to an input of multiplexer 1046 at node 1042. A PRBS test signal is coupled to a selection input of multiplexer 1046 via node 1044. A roll test signal is coupled to an input of multiplexer 1046 via node 1048. The output of multiplexer 1046 is coupled to node 1002.

Node 1002 is coupled to a serial data input of a shift register comprising flip-flops 1016, 1018, 1020, and 1022. A load signal for performing a parallel data load of the shift register is provided to the shift register at node 1004. A transmit clock signal is provided to a clock input of the shift register at node 1006. Nodes 1008, 1010, 1012, and 1014 are coupled to parallel load data inputs of shift registers 1016, 1018, 1020, and 1022, respectively.

Node 1024 is taken from a serial data output of the shift register at the output of flip-flop 1022 and is coupled to an input of multiplexer 1026, an input of XOR gate 1034, and an input of multiplexer 1046. A signal at node 1032 taken from the data output of flip-flip 1016 is coupled to an input of XOR gate 1034. The output of XOR gate 1034 appears at node 1036, which is coupled to an input of multiplexer 1095. A fixed logic zero signal is coupled to an input of multiplexer 1095 via node 1091. A PRBS test signal is coupled to a selection input of multiplexer 1095 via node 1093. A roll test signal is coupled to a selection input of multiplexer of 1095 via node 1097. An output of multiplexer 1095 is coupled to node 1051.

Node 1051 is coupled to a serial data input of a shift register comprising flip-flops 1065, 1067, 1069, and 1071. A load signal for performing a parallel data load of the shift register is provided to the shift register at node 1053. A transmit clock signal is provided to a clock input of the shift register at node 1055. Nodes 1057, 1059, 1061, and 1063 are coupled to parallel load data inputs of flip-flops 1065, 1067, 1069, and 1071, respectively.

Node 1073 is taken from the serial data output of the shift register at the output of flip-flop 1071 and is coupled to an input of multiplexer 1076, to an input of XOR gate 1083, and to an input of multiplexer 1095. Node 1081 provides a signal taken from the data output of flip-flop of 1065 and provides it to an input of XOR gate 1083. The output of XOR gate 1083 appears at node 1085 and is coupled to an input of multiplexer of 1096. A fixed logic zero signal is coupled to an input of multiplexer 1096 via input 1092. A PRBS test signal is coupled to a selection input of multiplexer 1096 via node 1094. A roll test signal is coupled to a selection input of multiplexer 1096 via node 1098. The output of multiplexer 1096 is coupled to node 1052.

Node 1052 is coupled to a serial data input of a shift register comprising flip-flops 1066, 1068, 1070, and 1072. A load signal for performing a parallel data load of the shift register is provided to the shift register at node 1054. A transmit clock signal is provided to a clock input of the shift register at node 1056. Nodes 1058, 1060, 1062, and 1064 are coupled to parallel load data inputs of flip-flops 1066, 1068, 1070, and 1072, respectively.

Node 1074 provides a signal taken from the serial data output of the shift register at the output of flip-flop 1072 to an input of multiplexer 1076, to an input of XOR gate 1084, and to an input of multiplexer 1096. Node 1082 is taken from a data output of flip-flop 1066 and coupled to an input of XOR gate 1084. XOR gate 1084 provides an output at node 1086, which is coupled to an input of flip-flop 1038.

A transmit clock signal is provided to a clock input of flip-flop 1038 via node 1037. A PRBS test input signal is provided to an input of flip-flop 1038 via node 1049. An output of flip-flop 1038 is coupled to an input of multiplexer 1045 via node 1039. A fixed logic zero input is coupled to an input of multiplexer 1045 at node 1041. A PRBS test signal is coupled to a selection input of multiplexer 1045 via node 1043. A roll test signal is coupled to a selection input of multiplexer 1045 via node 1047. An output of multiplexer 1045 is coupled to node 1001.

A transmit clock signal is provided to multiplexer 1026 via node 1025. The output of multiplexer of 1026 is coupled via node 1030 to an input of output driver 1027. A transmit clock signal is coupled to an input of multiplexer of 1076 via node 1075. The output of multiplexer 1076 is coupled to output driver 1027 via node 1080. Output driver 1027 provides an output at node 1028, which is coupled to pad 1029.

Figure 11:
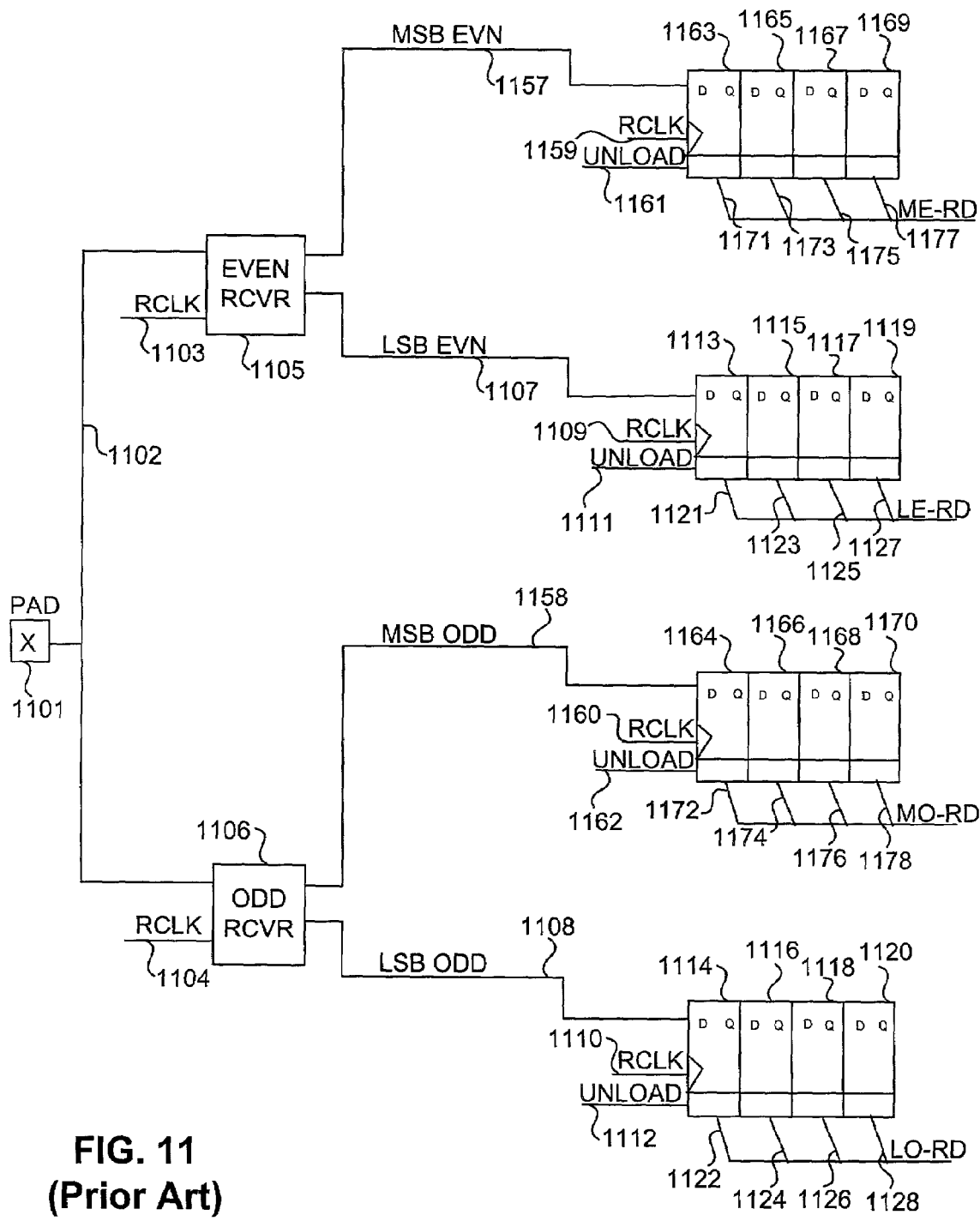
FIG. 11 is a logic diagram illustrating a prior art quad signaling level receive circuit.

FIG. 11 is a logic diagram illustrating a prior art quad signaling level receive circuit. Pad 1101 is coupled to node 1102, which is coupled to even receiver 1105 and to odd receiver 1106. A receive clock signal is provided to even receiver 1105 at node 1103 and to odd receiver 1106 at node 1104.

The most significant bits (MSB) from even receiver 1105 are passed to an input of a shift register comprising flip-flops 1163, 1165, 1167, and 1169 via node 1157. A receive clock signal is provided to a clock input of the shift register via node 1159. An unload signal for providing parallel data outputs from the shift register is applied to the shift register via node 1161. Parallel data are provided at parallel data outputs 1171, 1173, 1175, and 1177 of flip-flops 1163, 1165, 1167, and 1169, respectively.

The least significant bits (LSB) from even receiver 1105 are passed to an input of a shift register comprising flip-flops 1113, 1115, 1117, and 1119 via node 1107. A receive clock signal is provided to a clock input of the shift register via node 1109. An unload signal for providing parallel data outputs from the shift register is applied to the shift register via node 1111. Parallel data are provided at parallel data outputs 1121, 1123, 1125, and 1127 of flip-flops 1113, 1115, 1117, and 1119, respectively.

The most significant bits (MSB) from odd receiver 1106 are passed to an input of a shift register comprising flip-flops 1164, 1166, 1168, and 1170 via node 1158. A receive clock signal is provided to a clock input of the shift register via node 1160. An unload signal for providing parallel data outputs from the shift register is applied to the shift register via node 1162. Parallel data are provided at parallel data outputs 1172, 1174, 1176, and 1178 of flip-flops 1164, 1166, 1168, and 1170, respectively.

The least significant bits (LSB) from even receiver 1106 are passed to an input of a shift register comprising flip-flops 1114, 1116, 1118, and 1120 via node 1108. A receive clock signal is provided to a clock input of the shift register via node 1110. An unload signal for providing parallel data outputs from the shift register is applied to the shift register via node 1112. Parallel data are provided at parallel data outputs 1122, 1124, 1126, and 1128 of flip-flops 1114, 1116, 1118, and 1120, respectively.

Figure 12:
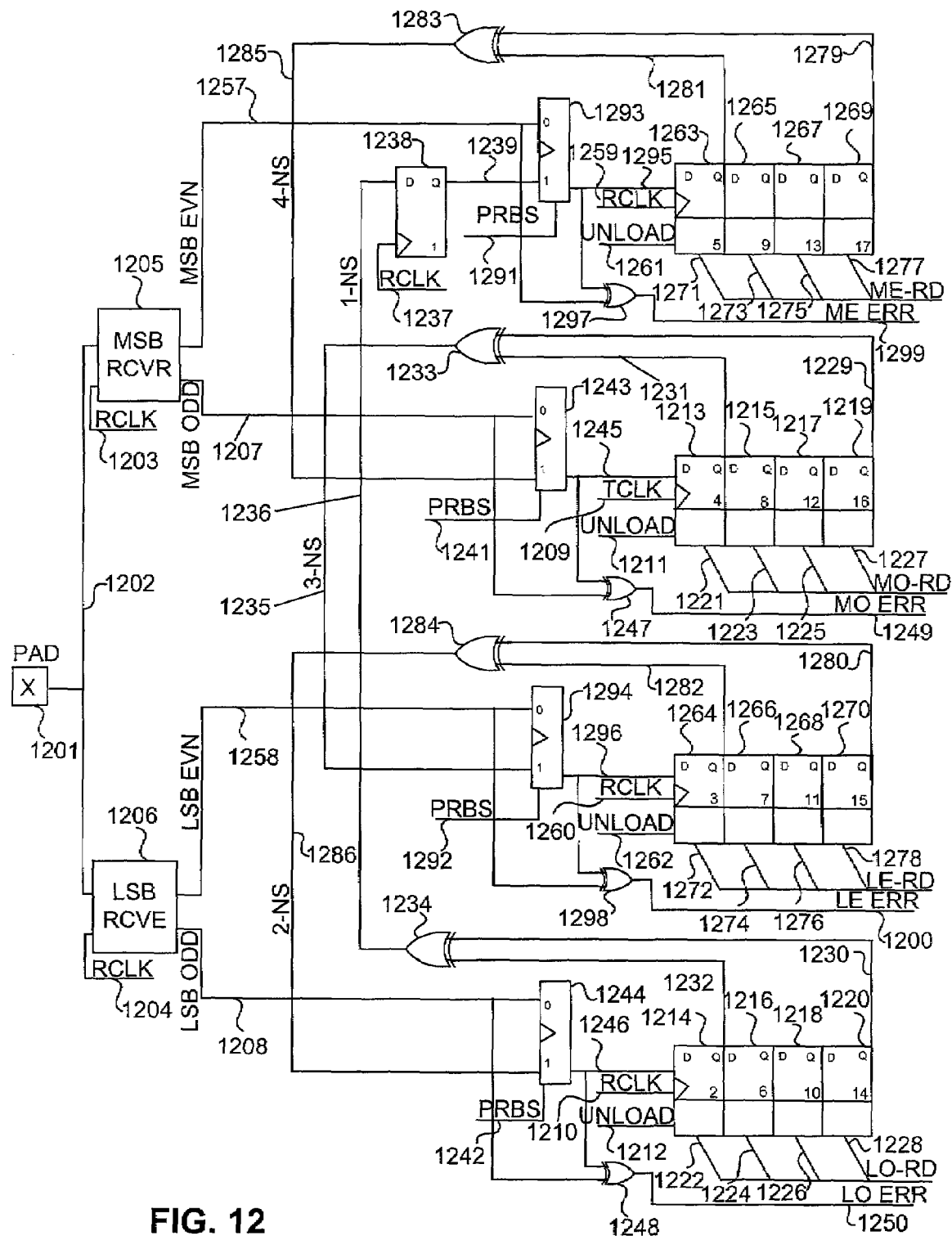
FIG. 12 is a logic diagram illustrating a quad signaling level receive circuit capable of operating in a PRBS test mode in accordance with an embodiment of the invention.

FIG. 12 is a logic diagram illustrating a quad signaling level receive circuit capable of operating in a PRBS test mode in accordance with an embodiment of the invention. Pad 1201 is coupled to node 1202, which is coupled to most significant bits (MSB) receiver 1205 and least significant bits (LSB) receiver 1206. A receive clock signal is provided to MSB receiver 1205 at node 1203 and to LSB receiver 1206 at node 1204.

Even-numbered bits from MSB receiver 1205 are passed to an input of multiplexer 1293 and to an input of XOR gate 1297 via node 1257. The output of multiplexer 1293 is coupled to an input of XOR gate 1297 and to a serial data input of a shift register comprising flip-flops 1263, 1265, 1267, and 1269 via node 1295. An output of XOR gate 1297 is provided at node 1299. A receive clock signal is provided to a clock input of the shift register via node 1259. An unload signal for providing parallel data outputs from the shift register is applied to the shift register via node 1261. Parallel data are provided at parallel data outputs 1271, 1273, 1275, and 1277 of flip-flops 1263, 1265, 1267, and 1269, respectively.

An output of flip-flop 1269 is coupled to an input of XOR gate 1283 via node 1279. An output of flip-flop 1263 is coupled to an input of XOR gate 1283 via node 1281. An output of XOR gate 1283 is coupled to an input of multiplexer 1243 via node 1285. A PRBS test signal is applied to a selection input 1241 of multiplexer 1243.

Odd-numbered bits from MSB receiver 1205 are passed to an input of multiplexer 1243 and to an input of XOR gate 1247 via node 1207. The output of multiplexer 1243 is coupled to an input of XOR gate 1247 and to the serial data input of a shift register comprising flip-flops 1213, 1215, 1217, and 1219 via node 1245. An output of XOR gate 1247 is provided at node 1249. A receive clock signal is provided to a clock input of the shift register via node 1209. An unload signal for providing parallel data outputs from the shift register is applied to the shift register via node 1211. Parallel data are provided at parallel data outputs 1221, 1223, 1225, and 1227 of flip-flops 1213, 1215, 1217, and 1219, respectively.

An output of flip-flop 1219 is coupled to an input of XOR gate 1233 via node 1229. An output of flip-flop 1213 is coupled to an input of XOR gate 1233 via node 1231. An output of XOR gate 1233 is coupled to an input of multiplexer 1294 via node 1235. A PRBS test signal is applied to a selection input 1292 of multiplexer 1294.

Even-numbered bits from LSB receiver 1206 are passed to an input of multiplexer 1294 and to an input of XOR gate 1298 via node 1258. The output of multiplexer 1294 is coupled to an input of XOR gate 1298 and to the serial data input of a shift register comprising flip-flops 1264, 1266, 1268, and 1270 via node 1296. An output of XOR gate 1298 is provided at node 1200. A receive clock signal is provided to a clock input of the shift register via node 1260. An unload signal for providing parallel data outputs from the shift register is applied to the shift register via node 1262. Parallel data are provided at parallel data outputs 1272, 1274, 1276, and 1278 of flip-flops 1264, 1266, 1268, and 1270, respectively.

An output of flip-flop 1270 is coupled to an input of XOR gate 1284 via node 1280. An output of flip-flop 1264 is coupled to an input of XOR gate 1284 via node 1282. An output of XOR gate 1284 is coupled to an input of multiplexer 1244 via node 1286. A PRBS test signal is applied to a selection input 1242 of multiplexer 1244.

Odd-numbered bits from LSB receiver 1206 are passed to an input of multiplexer 1244 and to an input of XOR gate 1248 via node 1208. The output of multiplexer 1244 is coupled to an input of XOR gate 1248 and to the serial data input of a shift register comprising flip-flops 1214, 1216, 1218, and 1220 via node 1246. An output of XOR gate 1248 is provided at node 1250. A receive clock signal is provided to a clock input of the shift register via node 1210. An unload signal for providing parallel data outputs from the shift register is applied to the shift register via node 1212. Parallel data are provided at parallel data outputs 1222, 1224, 1226, and 1228 of flip-flops 1214, 1216, 1218, and 1220, respectively.

An output of flip-flop 1220 is coupled to an input of XOR gate 1234 via node 1230. An output of flip-flop 1214 is coupled to an input of XOR gate 1234 via node 1232. An output of XOR gate 1234 is coupled to an input of flip-flop 1238 via node 1236. A receive clock signal is applied to a clock input 1237 of flip-flop 1238. An output of flip-flop 1238 is coupled to an input of multiplexer 1293 via node 1239. A PRBS test signal is applied to a selection input 1291 of multiplexer 1293.

Figure 13:
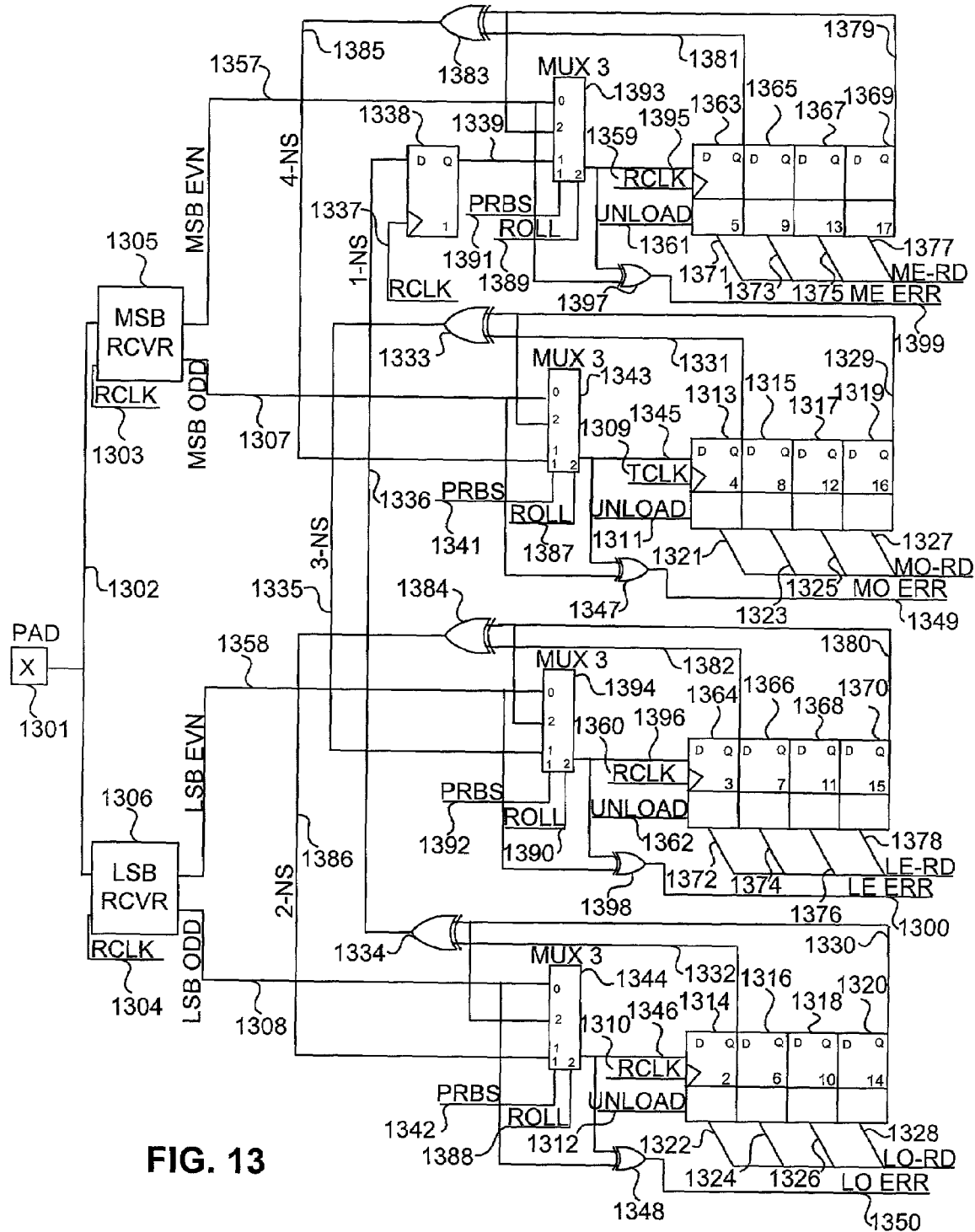
FIG. 13 is a logic diagram illustrating a quad signaling level receive circuit capable of operating in a PRBS test mode and a roll test mode in accordance with an embodiment of the invention.

FIG. 13 is a logic diagram illustrating a quad signaling level receive circuit capable of operating in a PRBS test mode and a roll test mode in accordance with an embodiment of the invention. Pad 1301 is coupled to node 1302, which is coupled to most significant bits (MSB) receiver 1305 and least significant bits (LSB) receiver 1306. A receive clock signal is provided to MSB receiver 1305 at node 1303 and to LSB receiver 1306 at node 1304.

Even-numbered bits from MSB receiver 1305 are passed to an input of multiplexer 1393 and to an input of XOR gate 1397 via node 1357. The output of multiplexer 1393 is coupled to an input of XOR gate 1397 and to a serial data input of a shift register comprising flip-flops 1363, 1365, 1367, and 1369 via node 1395. An output of XOR gate 1397 is provided at node 1399. A receive clock signal is provided to a clock input of the shift register via node 1359. An unload signal for providing parallel data outputs from the shift register is applied to the shift register via node 1361. Parallel data are provided at parallel data outputs 1371, 1373, 1375, and 1377 of flip-flops 1363, 1365, 1367, and 1369, respectively.

An output of flip-flop 1369 is coupled to an input of XOR gate 1383 and to an input of multiplexer 1393 via node 1379. An output of flip-flop 1363 is coupled to an input of XOR gate 1383 via node 1381. An output of XOR gate 1383 is coupled to an input of multiplexer 1343 via node 1385. A PRBS test signal is applied to a selection input 1341 of multiplexer 1343. A roll test signal is applied to a selection input 1387 of multiplexer 1343.

Odd-numbered bits from MSB receiver 1305 are passed to an input of multiplexer 1343 and to an input of XOR gate 1347 via node 1307. The output of multiplexer 1343 is coupled to an input of XOR gate 1347 and to the serial data input of a shift register comprising flip-flops 1313, 1315, 1317, and 1319 via node 1345. An output of XOR gate 1347 is provided at node 1349. A receive clock signal is provided to a clock input of the shift register via node 1309. An unload signal for providing parallel data outputs from the shift register is applied to the shift register via node 1311. Parallel data are provided at parallel data outputs 1321, 1323, 1325, and 1327 of flip-flops 1313, 1315, 1317, and 1319, respectively.

An output of flip-flop 1319 is coupled to an input of XOR gate 1333 and to an input of multiplexer 1343 via node 1329. An output of flip-flop 1313 is coupled to an input of XOR gate 1333 via node 1331. An output of XOR gate 1333 is coupled to an input of multiplexer 1394 via node 1335. A PRBS test signal is applied to a selection input 1392 of multiplexer 1394. A roll test signal is applied to a selection input 1390 of multiplexer 1394.

Even-numbered bits from LSB receiver 1306 are passed to an input of multiplexer 1394 and to an input of XOR gate 1398 via node 1358. The output of multiplexer 1394 is coupled to an input of XOR gate 1398 and to the serial data input of a shift register comprising flip-flops 1364, 1366, 1368, and 1370 via node 1396. An output of XOR gate 1398 is provided at node 1300. A receive clock signal is provided to a clock input of the shift register via node 1360. An unload signal for providing parallel data outputs from the shift register is applied to the shift register via node 1362. Parallel data are provided at parallel data outputs 1372, 1374, 1376, and 1378 of flip-flops 1364, 1366, 1368, and 1370, respectively.

An output of flip-flop 1370 is coupled to an input of XOR gate 1384 and to an input of multiplexer 1394 via node 1380. An output of flip-flop 1364 is coupled to an input of XOR gate 1384 via node 1382. An output of XOR gate 1384 is coupled to an input of multiplexer 1344 via node 1386. A PRBS test signal is applied to a selection input 1342 of multiplexer 1344. A roll test signal is applied to a selection input 1388 of multiplexer 1344.

Odd-numbered bits from LSB receiver 1306 are passed to an input of multiplexer 1344 and to an input of XOR gate 1348 via node 1308. The output of multiplexer 1344 is coupled to an input of XOR gate 1348 and to the serial data input of a shift register comprising flip-flops 1314, 1316, 1318, and 1320 via node 1346. An output of XOR gate 1348 is provided at node 1350. A receive clock signal is provided to a clock input of the shift register via node 1310. An unload signal for providing parallel data outputs from the shift register is applied to the shift register via node 1312. Parallel data are provided at parallel data outputs 1322, 1324, 1326, and 1328 of flip-flops 1314, 1316, 1318, and 1320, respectively.

An output of flip-flop 1320 is coupled to an input of XOR gate 1334 and to an input of multiplexer 1344 via node 1330. An output of flip-flop 1314 is coupled to an input of XOR gate 1334 via node 1332. An output of XOR gate 1334 is coupled to an input of flip-flop 1338 via node 1336. A receive clock signal is applied to a clock input 1337 of flip-flop 1338. An output of flip-flop 1338 is coupled to an input of multiplexer 1393 via node 1339. A PRBS test signal is applied to a selection input 1391 of multiplexer 1393. A roll test signal is applied to a selection input 1389 of multiplexer 1393.

While embodiments of the invention have been described in reference to signaling systems generally, it should be understood that the invention may be applied to various types of signaling systems in various contexts. As an example, the invention may be implemented in a signaling system existing within a memory system. For example, an embodiment of the invention may be provided where either or both of the transmit circuit and the receive circuit are incorporated in either or both of a memory controller and a memory device. Thus, signaling relating to memory operations within the memory system may be evaluated and optimized. The term signaling is understood to be broadly applicable. Even within the specific context of a memory system, signaling is understood to refer to any type of signals that may exist, for example, address signals, control signals, and/or data signals. The invention may be applied to evaluate and optimize either or both of memory read operations and memory write operations.

Accordingly, a method and apparatus for evaluating and optimizing a signaling system has been described. It should be understood that the implementation of other variations and modifications of the invention in its various aspects will be apparent to those of ordinary skill in the art, and that the invention is not limited by the specific embodiments described. It is therefore contemplated to cover by the present invention, any and all modifications, variations, or equivalents that fall within the spirit and scope of the basic underlying principles disclosed and claimed herein.

What is claimed is:

1. A transmit circuit comprising:
a transmit data storage element configured to receive data from a transmit data input and sequentially transmit a transmit data output signal when the transmit circuit is operating in a normal mode, the transmit data storage element further configured to provide a repeating pattern signal when the transmit circuit is operating in a test mode, the transmit circuit sequentially transmitting the transmit data output signal based on the repeating pattern signal when the transmit circuit is operating in the test mode, wherein the transmit data storage element is loaded from the transmit data input to initialize the test mode.

2. The transmit circuit of claim 1 wherein the transmit data storage element comprises a shift register.

3. The transmit circuit of claim 1 further comprising:
a test loop coupled to the transmit data storage element when the transmit circuit is operating in the test mode, the test loop providing feedback to allow the transmit data storage element to provide the repeating pattern signal.

4. The transmit circuit of claim 1 wherein the repeating pattern signal has a data length greater than a data capacity of the transmit data storage element.

5. The transmit circuit of claim 1 wherein the repeating pattern signal represents a sequence of data bits, the transmit data storage element storing each of the data bits.

6. The transmit circuit of claim 1 wherein, when the transmit data storage element is divided into transmit data storage sub-elements during operation in the normal mode, the transmit data storage sub-elements are combined as the transmit data storage element for providing the repeating pattern signal when the transmit circuit is operating in the test mode.

7. The transmit circuit of claim 1 wherein the transmit data storage element is loaded via a parallel transmit load input.

8. The transmit circuit of claim 1 wherein the transmit circuit receives an adjustment signal from a receive circuit, the receive circuit receiving the transmit data output signal, the transmit circuit adjusting a parameter of the transmit data output signal based on the adjustment signal.

9. The transmit circuit of claim 8 wherein the receive circuit is embodied in a first memory device and a second receive circuit is embodied in a second memory device.

10. The transmit circuit of claim 9 wherein the transmit circuit adjusts the parameter to a first value for communication with the first memory device and to a second value for communication with the second memory device.

11. A method for operating a transmit circuit to provide for evaluation of a digital signaling system comprising the steps of:
passing transmit data through the transmit circuit when the transmit circuit is operating in a normal mode; and
generating a transmit repeating pattern in the transmit circuit when the transmit circuit is operating in a test mode by uniting a plurality of pipeline structures within the transmit circuit into a transmit repeating pattern generator when the transmit circuit is operating in the test mode.

12. The method of claim 11 wherein the step of generating a transmit repeating pattern in the transmit circuit further comprises the step of:
preloading an initialization pattern into the transmit circuit.

13. The method of claim 11 wherein the step of passing transmit data through the transmit circuit further comprises the step of:
passing distinct data through each of the plurality of pipeline structures when the transmit circuit is operating in the normal mode.

14. The method of claim 11 further comprising the steps of:
receiving the transmit data in a receive circuit when the transmit circuit is operating in the normal mode; and
receiving the transmit repeating pattern in the receive circuit when the transmit circuit is operating in the test mode.

15. The method of claim 11 further comprising the steps of:
receiving the transmit data in a receive circuit when the transmit circuit is operating in the normal mode; and
receiving the transmit repeating pattern in a test receiver separate from the receive circuit when the transmit circuit is operating in the test mode.

16. A method for operating a receive circuit to provide for evaluation of a digital signaling system comprising the steps of:
passing receive data through the receive circuit when the receive circuit is operating in a normal mode; and
generating a receive repeating pattern in the receive circuit when the receive circuit is operating in a test mode by uniting a plurality of pipeline structures within the receive circuit into a receive repeating pattern generator when the receive circuit is operating in the test mode.

17. The method of claim 16 wherein the step of generating a receive repeating pattern in the receive circuit further comprises the step of:
preloading an initialization pattern into the receive circuit.

18. The method of claim 16 wherein the step of passing receive data through the receive circuit further comprises the step of:
passing distinct data through each of the plurality of pipeline structures when the receive circuit is operating in the normal mode.

19. The method of claim 16 further comprising the steps of:
transmitting the receive data to the receive circuit from a transmit circuit when the receive circuit is operating in the normal mode; and
transmitting a transmit repeating pattern to the receive circuit from the transmit circuit when the receive circuit is operating in the test mode.

20. The method of claim 16 further comprising the steps of:
transmitting the receive data to the receive circuit from a transmit circuit when the receive circuit is operating in the normal mode; and
transmitting a transmit repeating pattern to the receive circuit from a test transmitter separate from the transmit circuit when the receive circuit is operating in the test mode.

21. A transmit circuit comprising:
a transmit data storage element configured to receive parallel data from a transmit data input and sequentially transmit a serial transmit data output signal when the transmit circuit is operating in a normal mode, the transmit data storage element further configured to provide a repeating pattern signal when the transmit circuit is operating in a test mode, the transmit circuit sequentially transmitting the serial transmit data output signal based on the repeating pattern signal when the transmit circuit is operating in the test mode, wherein the transmit data storage element is loaded from the transmit data input to initialize the test mode.

22. A receive circuit comprising:
a receive data storage element configured to output a parallel receive data output signal based on a serial receive data input signal received at a receive data input when the receive circuit is operating in a normal mode, the receive data storage element further configured to provide a repeating pattern signal when the receive circuit is operating in a test mode; and
a comparison element configured to perform a comparison of a relationship between the repeating pattern signal and the serial receive data input signal received at the receive data input and to produce a comparison output signal based on the comparison when the receive circuit is operating in the test mode;
wherein the receive data storage element is loaded from the receive data input to initialize the test mode.

* * * * *